(12) United States Patent
Chang et al.

(10) Patent No.: US 8,852,687 B2
(45) Date of Patent: Oct. 7, 2014

(54) ORGANIC LAYER DEPOSITION APPARATUS

(75) Inventors: Uno Chang, Yongin (KR); Jae-Kwang Ryu, Yongin (KR); Eun-Sun Choi, Yongin (KR); Byung-Su Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 237 days.

(21) Appl. No.: 13/198,591

(22) Filed: Aug. 4, 2011

(65) Prior Publication Data
US 2012/0145077 A1    Jun. 14, 2012

(30) Foreign Application Priority Data

Dec. 13, 2010    (KR) ........................ 10-2010-0127090

(51) Int. Cl.
| | | |
|---|---|---|
| *B05D 3/00* | (2006.01) | |
| *C23C 16/52* | (2006.01) | |
| *C23C 16/44* | (2006.01) | |
| *C23C 14/24* | (2006.01) | |
| *C23C 14/12* | (2006.01) | |
| *C23C 14/04* | (2006.01) | |
| *C23C 14/56* | (2006.01) | |
| *H01L 51/56* | (2006.01) | |

(52) U.S. Cl.
CPC .............. *C23C 14/12* (2013.01); *C23C 14/243* (2013.01); *H01L 51/56* (2013.01); *C23C 14/042* (2013.01); *C23C 14/568* (2013.01)
USPC .............................................. 427/294; 427/8

(58) Field of Classification Search
None
See application file for complete search history.

(56) References Cited

U.S. PATENT DOCUMENTS

| | | |
|---|---|---|
| 4,416,217 A | 11/1983 | Nakamura et al. |
| 4,468,648 A | 8/1984 | Uchikune |
| 4,687,939 A | 8/1987 | Miyauchi et al. |
| 4,792,378 A | 12/1988 | Rose et al. |
| 4,901,667 A | 2/1990 | Suzuki et al. |
| 5,454,847 A | 10/1995 | Jacoboni et al. |
| 5,460,654 A | 10/1995 | Kikkawa et al. |
| 5,487,609 A | 1/1996 | Asada |
| 5,742,129 A | 4/1998 | Nagayama et al. |
| 5,909,995 A | 6/1999 | Wolf et al. |
| 6,045,671 A | 4/2000 | Wu et al. |
| 6,091,195 A | 7/2000 | Forrest et al. |

(Continued)

FOREIGN PATENT DOCUMENTS

| | | |
|---|---|---|
| CN | 1476279 A | 2/2004 |
| CN | 1489419 A | 4/2004 |

(Continued)

OTHER PUBLICATIONS

Patent Abstracts of Japan, and English machine translation of Japanese Publication 2001-052862, 20 pages.

(Continued)

*Primary Examiner* — Dah-Wei D Yuan
*Assistant Examiner* — Jethro Pence
(74) *Attorney, Agent, or Firm* — Christie, Parker & Hale, LLP

(57) ABSTRACT

An organic layer deposition apparatus for forming an organic layer while a substrate is being moved, in which an interval between the substrate and the organic layer deposition apparatus can be measured at a vacuum condition.

21 Claims, 15 Drawing Sheets

(56) References Cited

U.S. PATENT DOCUMENTS

| | | | |
|---|---|---|---|
| 6,099,649 A | 8/2000 | Schmitt et al. |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 | 4/2007 | Fujii et al. |
| 7,282,855 B2 | 10/2007 | Park et al. |
| 7,322,248 B1 | 1/2008 | Long |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 | 6/2012 | Kang et al. |
| 2001/0004186 A1 | 6/2001 | Song et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0033136 A1 | 3/2002 | Savage et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0021886 A1 | 1/2003 | Baele |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0124764 A1 | 7/2003 | Yamazaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0016907 A1 | 1/2004 | Shi |
| 2004/0029028 A1 | 2/2004 | Shimizu |
| 2004/0056244 A1 | 3/2004 | Marcus et al. |
| 2004/0086639 A1 | 5/2004 | Grantham et al. |
| 2004/0096771 A1 | 5/2004 | Kashiwagi et al. |
| 2004/0115338 A1 | 6/2004 | Yoneda |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2006/0011136 A1 | 1/2006 | Yamazaki et al. |
| 2006/0012771 A1 | 1/2006 | Jeong |
| 2006/0022590 A1 | 2/2006 | Aziz et al. |
| 2006/0040132 A1 | 2/2006 | Liao et al. |
| 2006/0045958 A1* | 3/2006 | Abiko et al. ................ 427/66 |
| 2006/0066231 A1 | 3/2006 | Nishikawa et al. |
| 2006/0090705 A1 | 5/2006 | Kim |
| 2006/0102078 A1 | 5/2006 | Fairbairn et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1 | 1/2007 | Manz et al. |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0148337 A1 | 6/2007 | Nichols et al. |
| 2007/0148348 A1 | 6/2007 | Huh et al. |
| 2007/0157879 A1 | 7/2007 | Yotsuya |
| 2007/0158471 A1 | 7/2007 | Park et al. |
| 2007/0163497 A1 | 7/2007 | Grace et al. |
| 2007/0178708 A1* | 8/2007 | Ukigaya ................ 438/758 |
| 2007/0190235 A1 | 8/2007 | Yamazaki et al. |
| 2007/0195844 A1 | 8/2007 | Ma et al. |
| 2007/0231460 A1 | 10/2007 | Ukigaya |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0038935 A1 | 2/2008 | Baude et al. |
| 2008/0057183 A1 | 3/2008 | Spindler et al. |

(56) References Cited

U.S. PATENT DOCUMENTS

| | | |
|---|---|---|
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0216741 A1 | 9/2008 | Ling et al. |
| 2008/0238294 A1 | 10/2008 | Xu et al. |
| 2008/0251785 A1 | 10/2008 | Noh et al. |
| 2008/0286461 A1 | 11/2008 | Noguchi et al. |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0014412 A1 | 1/2009 | Nozawa et al. |
| 2009/0017192 A1 | 1/2009 | Matsuura |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0170230 A1 | 7/2009 | Kidu et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0001301 A1 | 1/2010 | Karg et al. |
| 2010/0055810 A1 | 3/2010 | Sung et al. |
| 2010/0086672 A1* | 4/2010 | Von Drasek et al. .............. 427/9 |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0123707 A1 | 5/2011 | Lee et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |
| 2013/0157016 A1 | 6/2013 | Kim |
| 2013/0217164 A1 | 8/2013 | Kang et al. |
| 2013/0291796 A1 | 11/2013 | Inoue et al. |
| 2013/0298829 A1 | 11/2013 | Jo et al. |
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |

FOREIGN PATENT DOCUMENTS

| | | |
|---|---|---|
| CN | 1556872 A | 12/2004 |
| CN | 1607868 A | 4/2005 |
| CN | 1682569 A | 10/2005 |
| CN | 1704501 A | 12/2005 |
| CN | 1814854 A | 8/2006 |
| CN | 1841696 A | 10/2006 |
| EP | 1 413 644 A2 | 4/2004 |
| EP | 1 418 250 A2 | 5/2004 |
| EP | 1 518 940 A1 | 3/2005 |
| EP | 2354270 A1 | 8/2011 |
| JP | 57-194252 A2 | 11/1982 |
| JP | 2-247372 | 10/1990 |
| JP | 04-272170 | 9/1992 |
| JP | 5-22405 U1 | 3/1993 |
| JP | 5-98425 A2 | 4/1993 |
| JP | 5-230628 A2 | 9/1993 |
| JP | 08-027568 | 1/1996 |
| JP | 9-95776 A2 | 4/1997 |
| JP | 10-50478 | 2/1998 |
| JP | 10-120171 | 5/1998 |
| JP | 10-270535 | 10/1998 |
| JP | 11-144865 | 5/1999 |
| JP | 2000-068054 | 3/2000 |
| JP | 2000-282219 | 10/2000 |
| JP | 2000-323277 | 11/2000 |
| JP | 2001-28325 A2 | 1/2001 |
| JP | 2001-052862 | 2/2001 |
| JP | 2001-093667 | 4/2001 |
| JP | 2002-75638 A2 | 3/2002 |
| JP | 2002-175878 | 6/2002 |
| JP | 2002-348659 A2 | 12/2002 |
| JP | 2003-003250 | 1/2003 |
| JP | 2003-077662 | 3/2003 |
| JP | 2003-157973 | 5/2003 |
| JP | 2003-197531 A2 | 7/2003 |
| JP | 2003-297562 | 10/2003 |
| JP | 2003-321767 A2 | 11/2003 |
| JP | 2003-347394 A2 | 12/2003 |
| JP | 2004-035964 A2 | 2/2004 |
| JP | 2004-043898 | 2/2004 |

(56) References Cited

FOREIGN PATENT DOCUMENTS

| | | |
|---|---|---|
| JP | 2004-76150 A2 | 3/2004 |
| JP | 2004-91858 A2 | 3/2004 |
| JP | 2004-103269 | 4/2004 |
| JP | 2004-103341 | 4/2004 |
| JP | 2004-107764 A2 | 4/2004 |
| JP | 2004-137583 A2 | 5/2004 |
| JP | 2004-143521 A2 | 5/2004 |
| JP | 2004-169169 A2 | 6/2004 |
| JP | 2004-199919 | 7/2004 |
| JP | 2004-342455 A2 | 12/2004 |
| JP | 2004-349101 | 12/2004 |
| JP | 2004-355975 | 12/2004 |
| JP | 2005-044592 | 2/2005 |
| JP | 2005-101505 | 4/2005 |
| JP | 2005-122980 A2 | 5/2005 |
| JP | 2005-165015 A2 | 6/2005 |
| JP | 2005-174843 A2 | 6/2005 |
| JP | 2005-206939 A | 8/2005 |
| JP | 2005-213616 A2 | 8/2005 |
| JP | 2005-235568 | 9/2005 |
| JP | 2005-293968 | 10/2005 |
| JP | 2005-296737 | 10/2005 |
| JP | 2006-028583 | 2/2006 |
| JP | 2006-172930 | 6/2006 |
| JP | 2006-176809 | 7/2006 |
| JP | 2006-210038 A2 | 8/2006 |
| JP | 2006-219760 | 8/2006 |
| JP | 2006-275433 | 10/2006 |
| JP | 2006-292955 | 10/2006 |
| JP | 2006-307247 A2 | 11/2006 |
| JP | 2007-047293 | 2/2007 |
| JP | 2007-66862 | 3/2007 |
| JP | 2007-146219 | 6/2007 |
| JP | 2007-157886 | 6/2007 |
| JP | 2007-186740 A2 | 7/2007 |
| JP | 2007-242436 | 9/2007 |
| JP | 2007-291506 A2 | 11/2007 |
| JP | 2008-19477 A2 | 1/2008 |
| JP | 2008-108628 A2 | 5/2008 |
| JP | 2008-121098 | 5/2008 |
| JP | 2008-521165 A2 | 6/2008 |
| JP | 2008-196003 | 8/2008 |
| JP | 2008-248301 A2 | 10/2008 |
| JP | 2008-300056 | 12/2008 |
| JP | 2009-019243 | 1/2009 |
| JP | 2009-024208 A | 2/2009 |
| JP | 2009-049223 | 3/2009 |
| JP | 2009-081165 | 4/2009 |
| JP | 2009-087910 | 4/2009 |
| JP | 2009-117231 A2 | 5/2009 |
| JP | 2010-159167 A2 | 7/2010 |
| JP | 2010-261081 | 11/2010 |
| JP | 2011-47035 | 3/2011 |
| JP | 2011-146377 | 7/2011 |
| JP | 2012-92448 | 5/2012 |
| JP | 2012-211352 | 11/2012 |
| KR | 1997-0008709 A | 2/1997 |
| KR | 10-0257219 B1 | 2/2000 |
| KR | 10-2000-0019254 | 4/2000 |
| KR | 10-2000-0023929 | 5/2000 |
| KR | 2001-0024652 A | 3/2001 |
| KR | 2001-0030175 A | 4/2001 |
| KR | 10-2001-0039298 A | 5/2001 |
| KR | 10-2001-0059939 | 7/2001 |
| KR | 10-2001-0092914 A | 10/2001 |
| KR | 2001-0093666 | 10/2001 |
| KR | 20-0257218 Y1 | 12/2001 |
| KR | 10-2002-0000201 | 1/2002 |
| KR | 2002-0001555 A | 1/2002 |
| KR | 10-2002-0050922 | 6/2002 |
| KR | 10-2002-0090934 | 12/2002 |
| KR | 10-2002-0091457 A | 12/2002 |
| KR | 2003-0001745 A | 1/2003 |
| KR | 10-2003-0034730 | 5/2003 |
| KR | 10-2003-0043012 A | 6/2003 |
| KR | 2003-0046090 A | 6/2003 |
| KR | 2003-0069684 A | 8/2003 |
| KR | 10-0405080 | 11/2003 |
| KR | 10-0406059 B1 | 11/2003 |
| KR | 10-2003-0091947 | 12/2003 |
| KR | 10-2003-0093959 | 12/2003 |
| KR | 2003-0094033 A | 12/2003 |
| KR | 10-2004-0014258 | 2/2004 |
| KR | 20-0342433 Y1 | 2/2004 |
| KR | 10-2004-0034537 | 4/2004 |
| KR | 10-2004-0039910 A | 5/2004 |
| KR | 10-0430336 B1 | 5/2004 |
| KR | 10-2004-0050045 | 6/2004 |
| KR | 10-2004-0069281 | 8/2004 |
| KR | 10-2004-0084747 | 10/2004 |
| KR | 10-2004-0087142 | 10/2004 |
| KR | 10-2004-0110718 A | 12/2004 |
| KR | 10-0463212 | 12/2004 |
| KR | 10-2005-0018234 A | 2/2005 |
| KR | 10-2005-0024324 A | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 A | 6/2005 |
| KR | 10-2005-0082644 A | 8/2005 |
| KR | 10-0520159 | 10/2005 |
| KR | 10-0532657 B1 | 12/2005 |
| KR | 10-2006-0008602 | 1/2006 |
| KR | 10-2006-0018745 | 3/2006 |
| KR | 10-2006-0020050 A | 3/2006 |
| KR | 10-2006-0045225 A | 5/2006 |
| KR | 10-2006-0049050 A | 5/2006 |
| KR | 10-2006-0051746 A | 5/2006 |
| KR | 10-2006-0053926 A | 5/2006 |
| KR | 10-2006-0056706 A | 5/2006 |
| KR | 10-2006-0058459 A | 5/2006 |
| KR | 10-2009-0052828 A | 5/2006 |
| KR | 10-2006-0059068 A | 6/2006 |
| KR | 10-2006-0059323 A | 6/2006 |
| KR | 10-2006-0060994 | 6/2006 |
| KR | 10-2006-0065978 A | 6/2006 |
| KR | 10-2006-0073367 | 6/2006 |
| KR | 10-2006-0077887 A | 7/2006 |
| KR | 10-2006-0080475 | 7/2006 |
| KR | 10-2006-0080481 | 7/2006 |
| KR | 10-2006-0080482 | 7/2006 |
| KR | 10-2006-0081943 A | 7/2006 |
| KR | 10-2006-0083510 | 7/2006 |
| KR | 10-2006-0092387 A | 8/2006 |
| KR | 10-2006-0098755 A | 9/2006 |
| KR | 10-2006-0104288 | 10/2006 |
| KR | 10-2006-0104675 | 10/2006 |
| KR | 10-2006-0104677 | 10/2006 |
| KR | 10-2006-0109561 A | 10/2006 |
| KR | 10-2006-0109627 | 10/2006 |
| KR | 10-0635903 B1 | 10/2006 |
| KR | 10-2006-0114462 | 11/2006 |
| KR | 10-2006-0114477 A | 11/2006 |
| KR | 10-2006-0114573 A | 11/2006 |
| KR | 10-0645719 B1 | 11/2006 |
| KR | 10-0646160 | 11/2006 |
| KR | 10-2006-0123944 A | 12/2006 |
| KR | 10-0687007 | 2/2007 |
| KR | 10-0696547 B1 | 3/2007 |
| KR | 10-0696550 | 3/2007 |
| KR | 10-0697663 B1 | 3/2007 |
| KR | 10-0698033 | 3/2007 |
| KR | 10-0700466 | 3/2007 |
| KR | 10-2007-0035796 | 4/2007 |
| KR | 10-2007-0037848 A | 4/2007 |
| KR | 10-0711885 | 4/2007 |
| KR | 10-2007-0050793 A | 5/2007 |
| KR | 10-0723627 B1 | 5/2007 |
| KR | 10-2007-0056190 A | 6/2007 |
| KR | 10-0726132 | 6/2007 |
| KR | 10-0736218 B1 | 7/2007 |
| KR | 10-0741142 B1 | 7/2007 |
| KR | 10-2007-0078713 | 8/2007 |
| KR | 10-2007-0080635 | 8/2007 |

(56) References Cited

FOREIGN PATENT DOCUMENTS

| | | |
|---|---|---|
| KR | 10-2007-0091437 A | 9/2007 |
| KR | 10-2006-0028115 | 10/2007 |
| KR | 10-2007-0097218 | 10/2007 |
| KR | 10-2007-0098122 A | 10/2007 |
| KR | 10-2007-0101842 | 10/2007 |
| KR | 10-2007-0105595 | 10/2007 |
| KR | 10-0768212 B1 | 10/2007 |
| KR | 10-0770653 B1 | 10/2007 |
| KR | 10-2007-0112668 A | 11/2007 |
| KR | 10-2007-0114094 A | 11/2007 |
| KR | 10-0739309 B1 | 12/2007 |
| KR | 10-0787457 B1 | 12/2007 |
| KR | 10-2008-0001184 | 1/2008 |
| KR | 10-2008-0003720 | 1/2008 |
| KR | 10-2008-0007896 A | 1/2008 |
| KR | 10-2008-0009285 A | 1/2008 |
| KR | 10-0797787 B1 | 1/2008 |
| KR | 10-0800125 B1 | 1/2008 |
| KR | 10-0815265 | 3/2008 |
| KR | 10-2008-0036983 | 4/2008 |
| KR | 10-0823508 B1 | 4/2008 |
| KR | 10-0823511 B1 | 4/2008 |
| KR | 10-2008-0044239 A | 5/2008 |
| KR | 10-2008-0044775 | 5/2008 |
| KR | 10-2008-0046761 A | 5/2008 |
| KR | 10-0827760 B1 | 5/2008 |
| KR | 10-2008-0048653 | 6/2008 |
| KR | 10-2008-0055124 A | 6/2008 |
| KR | 10-2008-0057159 A | 6/2008 |
| KR | 10-0839380 B1 | 6/2008 |
| KR | 10-2008-0060400 | 7/2008 |
| KR | 10-2008-0061132 | 7/2008 |
| KR | 10-2008-0061666 A | 7/2008 |
| KR | 10-2008-0061774 | 7/2008 |
| KR | 10-2008-0062212 | 7/2008 |
| KR | 10-0899623 B1 | 7/2008 |
| KR | 10-2008-0076574 A | 8/2008 |
| KR | 10-2008-0088737 A | 10/2008 |
| KR | 10-2008-0104479 A | 12/2008 |
| KR | 10-2008-0104695 A | 12/2008 |
| KR | 10-2008-0109559 A | 12/2008 |
| KR | 10-2009-0017910 A | 2/2009 |
| KR | 10-0889872 B1 | 3/2009 |
| KR | 10-2009-0038733 | 4/2009 |
| KR | 10-2009-0040618 A | 4/2009 |
| KR | 10-2009-0047953 A | 5/2009 |
| KR | 10-2009-0052155 A | 5/2009 |
| KR | 10-2009-0053417 A | 5/2009 |
| KR | 10-2009-0066996 A | 6/2009 |
| KR | 10-2009-0075887 A | 7/2009 |
| KR | 10-2009-0079765 A | 7/2009 |
| KR | 10-2009-0081717 A | 7/2009 |
| KR | 10-0908232 B1 | 7/2009 |
| KR | 10-2009-0093161 A | 9/2009 |
| KR | 10-2009-0094911 A | 9/2009 |
| KR | 10-2009-0097453 | 9/2009 |
| KR | 10-2009-0107702 | 10/2009 |
| KR | 10-0922763 A | 10/2009 |
| KR | 10-2010-0000128 A | 1/2010 |
| KR | 10-2010-0000129 A | 1/2010 |
| KR | 10-2010-0002381 A | 1/2010 |
| KR | 10-2010-0026655 A | 3/2010 |
| KR | 10-2010-0038088 A | 4/2010 |
| KR | 10-2010-0044606 A | 4/2010 |
| KR | 10-2010-0047796 | 5/2010 |
| KR | 10-0961110 B1 | 6/2010 |
| KR | 10-2010-0090070 A | 8/2010 |
| KR | 10-2010-0099806 A | 9/2010 |
| KR | 10-2010-0119368 A | 11/2010 |
| KR | 10-2010-0126125 | 12/2010 |
| KR | 10-2010-0128589 A | 12/2010 |
| KR | 10-2010-0130786 A | 12/2010 |
| KR | 10-2010-0138139 A | 12/2010 |
| KR | 10-1017654 B1 | 2/2011 |
| KR | 10-2011-0021090 A | 3/2011 |
| KR | 10-2011-0022512 A | 3/2011 |
| KR | 10-2011-0032589 A | 3/2011 |
| KR | 10-2011-0082418 A | 7/2011 |
| KR | 10-2011-0101767 A | 9/2011 |
| KR | 10-2011-0110525 A | 10/2011 |
| KR | 10-2011-0120213 A | 11/2011 |
| KR | 10-2012-0006322 A | 1/2012 |
| KR | 10-2012-0006324 | 1/2012 |
| KR | 10-2012-0012300 | 2/2012 |
| KR | 10-2012-0042155 A | 5/2012 |
| KR | 10-2012-0065789 A | 6/2012 |
| KR | 10-2012-0080855 A | 7/2012 |
| KR | 10-2012-0081811 A | 7/2012 |
| KR | 10-1193186 B1 | 10/2012 |
| KR | 10-2012-0131545 A | 12/2012 |
| KR | 10-2013-0007308 A | 1/2013 |
| WO | 9925894 A1 | 5/1999 |
| WO | 03043067 A1 | 5/2003 |
| WO | WO2004016406 A1 | 2/2004 |
| WO | 2008004792 A1 | 1/2008 |

OTHER PUBLICATIONS

Patent Abstracts of Japan, and English machine translation of Japanese Publication 2003-003250, 25 pages.
Korean Patent Abstracts, Publication No. 1020020086047, dated Nov. 18, 2002, for corresponding Korean Patent 10-0405080.
Korean Patent Abstracts, Publication No. 1020020088662, dated Nov. 29, 2002, for corresponding Korean Patent 10-0463212.
Korean Patent Abstracts, Publication No. 1020050045619, dated May 17, 2005, for corresponding Korean Patent 10-0520159.
Korean Patent Abstracts, Publication No. 1020040062203, dated Jul. 7, 2002, for corresponding Korean Patent 10-0646160.
Korean Patent Abstracts, Publication No. 1020060101987, dated Sep. 27, 2006, for corresponding Korean Patent 10-0687007.
Korean Patent Abstracts, Publication No. 1020020056238, dated Jul. 10, 2002, for corresponding Korean Patent 10-0698033.
Korean Patent Abstracts, Publication No. 1020050078637, datedugust 5, 2005, for corresponding Korean Patent 10-0700466.
Korean Patent Abstracts, Publication No. 1020070025164, dated Mar. 8, 2007, for corresponding Korean Patent 10-0711885.
Korean Patent Abstracts, Publication No. 1020020034272, dated May 9, 2002, for corresponding Korean Patent 10-0726132.
Korean Patent Abstracts, Publication No. 1020060126267, dated Dec. 6, 2006, for corresponding Korean Patent 10-0797787.
English Abstract, Publication No. 1020080002189, dated Jan. 4, 2008, for corresponding Korean Patent 10-0800125.
Korean Patent Abstracts, Publication No. 1020070050793. dated May 16, 2007, for corresponding Korean Patent 10-0815265.
Korean Patent Abstracts, Publication No. 1020010062735, dated Jul. 7, 2001, for corresponding Korean Patent 10-0827760.
Korean Patent Abstracts, Publication No. 1020080038650, dated May 7, 2008, for corresponding Korean Patent 10-0839380.
Machine English Translation of JP 2009-024208 A.
European Search Report dated May 13, 2011 for European Application No. 11250019.4 (6 pages).
European Search Report dated May 20, 2011 for European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).
U.S. Interview Summary dated Mar. 11, 2014 for U.S. Appl. No. 12/813,786 (4 pages).
U.S. Office action dated Apr. 1, 2013, issued to U.S. Appl. No. 12/784,774 (44 pages).
U.S. Office action dated Apr. 29, 2013, issued to U.S. Appl. No. 12/820,355 (31 pages).
U.S. Office action dated Aug. 13, 2013, issued to U.S. Appl. No. 13/194,759, (28 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).

(56) References Cited

OTHER PUBLICATIONS

U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 26, 2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 17, 2013, for cross reference U.S. Appl. No. 13/180,454, (23 pages).
U.S. Office Action dated Jun. 21, 2011 for U.S. Appl. No. 12/862,153 (21 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office Action dated Mar. 23, 2012 for U.S. Appl. No. 12/849,193 (17 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, issued to U.S. Appl. No. 12/849,092 (31 pages).
U.S. Office Action dated May 7, 2013, issued in U.S. Appl. No. 12/820,270 (37 pages).
U.S. Office action dated Nov. 20, 2013, for cross reference U.S. Appl. No. 12/868,099, (14 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office Action dated Oct. 3, 2013 for U.S. Appl. No. 12/869,830 (28 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Office action dated Sep. 25, 2013, for U.S. Appl. No. 13/031,756, (34 pages).
U.S. Patent Office Action dated May 16, 2013, issued to U.S. Appl. No. 13/235,337 (28 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20pages).
US Office action dated Sep. 12, 2012, in U.S. Appl. No. 12/515,673 (26 pages).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated May 9, 2014 for U.S. Appl. No. 13/194,759 (27 pages).
U.S. Office action dated Apr. 18, 2014, issued to U.S. Appl. No. 12/814,816 (9 pages).
U.S. Office action dated Sep. 27, 2013, issued to U.S. Appl. No. 12/814,816 (19 pages).

* cited by examiner

FIG. 1
FIG. 1 (PRIOR ART)
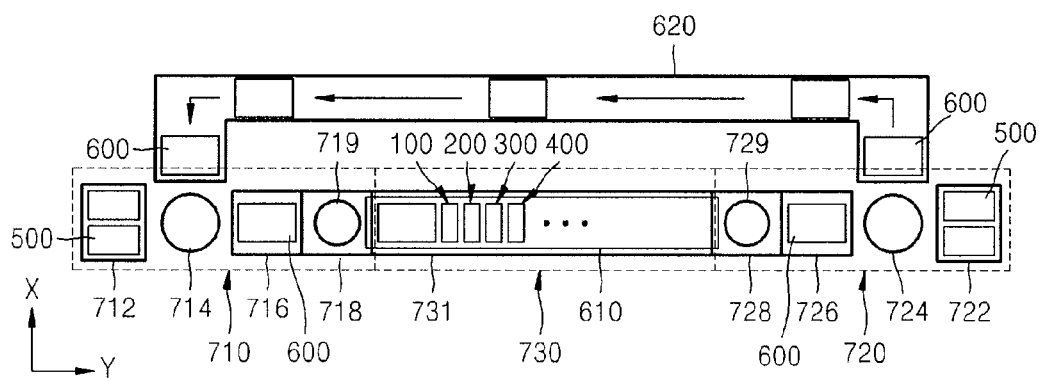
FIG. 2
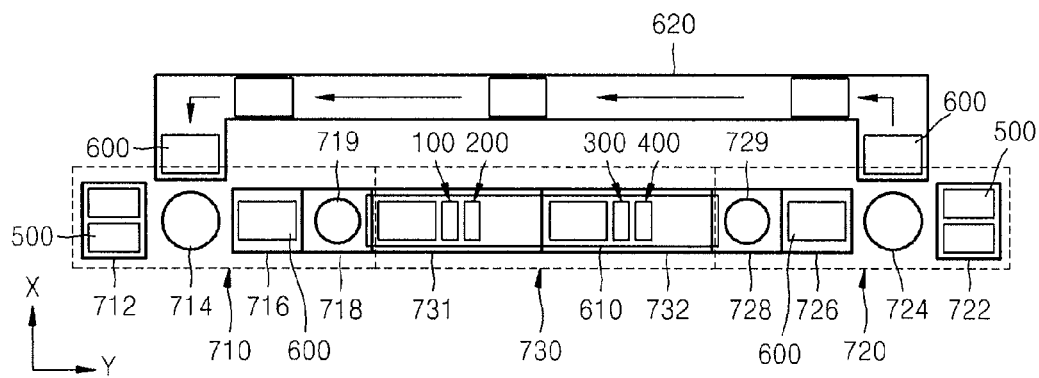

ORGANIC LAYER DEPOSITION APPARATUS

CROSS-REFERENCE TO RELATED PATENT APPLICATION

This application claims priority to and the benefit of Korean Patent Application No. 10-2010-0127090, filed on Dec. 13, 2010, in the Korean Intellectual Property Office, the disclosure of which is incorporated herein in its entirety by reference.

BACKGROUND

1. Field

An aspect of embodiments according to the present invention relates to an organic layer deposition apparatus.

2. Description of the Related Art

Organic light-emitting display devices have a larger viewing angle, better contrast characteristics, and a faster response speed in comparison to other display devices; therefore, the organic light-emitting display devices have drawn attention as a next-generation display device.

SUMMARY

In order to solve the problems of the contemporary deposition method using a fine metal mask (FMM), one or more aspects of embodiments according to the present invention provide an organic layer deposition apparatus that may be applied to simplify the production of large-sized display devices on a mass scale and that may be suitable for high-definition patterning.

According to an aspect of embodiments according to the present invention, there is provided an organic layer deposition apparatus for forming an organic layer on a substrate within a vacuum chamber, the apparatus including: a deposition source configured to discharge a deposition material; a deposition source nozzle unit located at a side of the deposition source, the deposition source nozzle unit including a plurality of deposition source nozzles arranged in a first direction; a patterning slit sheet located opposite to the deposition source nozzle unit, patterning slit sheet having a plurality of patterning slits arranged in a second direction perpendicular to the first direction; and an interval measuring unit configured to measure an interval between the substrate and the patterning slit sheet, wherein the organic layer deposition apparatus is configured to perform deposition while the substrate or the organic layer deposition apparatus is moved relative to the other in the first direction at a distance from the other, and the interval measuring unit is in the vacuum chamber and is configured to measure an interval between the substrate moving in the first direction and the patterning slit sheet.

The deposition source, the deposition source nozzle unit, and the patterning slit sheet may be integrally formed as a single body.

The deposition source and the deposition source nozzle unit, and the patterning slit sheet may be integrally connected as a single body by a connection member for guiding movement of the deposition material.

The connection member may seal a space between the deposition source nozzle unit located at the side of the deposition source, and the patterning slit sheet.

The plurality of deposition source nozzles may be tilted at an angle with respect to a vertical line of a surface from which the deposition source nozzle is extruded.

The plurality of deposition source nozzles may include deposition source nozzles arranged in two rows formed in the first direction, and the deposition source nozzles in one of the two rows may be tilted to face towards the deposition source nozzles in the other one of the two rows.

The plurality of deposition source nozzles may include deposition source nozzles arranged in two rows formed in the first direction, the deposition source nozzles of one of the two rows located at a first side of the patterning slit sheet may be arranged to face towards a second side of the patterning slit sheet, and the deposition source nozzles of the other one of the two rows located at the second side of the patterning slit sheet may be arranged to face towards the first side of the patterning slit sheet.

The interval measuring unit may measure the interval between the substrate and the patterning slit sheet in a vacuum condition.

The interval measuring unit may be located above the substrate, and a sensing pattern to be sensed by the interval measuring unit may be on one surface of the substrate.

The interval measuring unit may sense the sensing pattern from the moving substrate and then may sense one surface of the patterning slit sheet to measure the interval between the substrate and the patterning slit sheet.

The sensing pattern may be formed of metal.

The interval measuring unit may be located below the patterning slit sheet, the sensing pattern to be sensed by the interval measuring unit may be located on one surface of the substrate, and the patterning slit sheet may have a through hole, and a sensing target configured to cover the through hole.

The sensing target and the sensing pattern may be formed of metal.

The interval measuring unit may sense the sensing target and then may sense the sensing pattern from the moving substrate through the through hole from which the sensing target has been removed, to measure the interval between the substrate and the patterning slit sheet.

The interval measuring unit may be a capacitive sensor or an Eddy-current sensor.

The interval measuring unit may be located above the substrate and may sense one surface of the substrate and one surface of the patterning slit sheet so as to measure the interval between the substrate and the patterning slit sheet.

The interval measuring unit may be located below the patterning slit sheet, and the patterning slit sheet may have a through hole.

The interval measuring unit may sense one surface of the patterning slit sheet and may sense one surface of the substrate through the through hole so as to measure the interval between the substrate and the patterning slit sheet.

The interval measuring unit may be a confocal sensor.

According to another aspect of the present invention, there is provided an organic layer deposition apparatus for forming an organic layer on a substrate within a vacuum chamber, the apparatus including: a deposition source configured to discharge a deposition material; a deposition source nozzle unit located at a side of the deposition source, the deposition source nozzle unit including a plurality of deposition source nozzles arranged in a first direction; a patterning slit sheet located opposite to the deposition source nozzle unit, the patterning slit sheet having a plurality of patterning slits arranged in the first direction; a barrier plate assembly comprising a plurality of barrier plates that are located between the deposition source nozzle unit and the patterning slit sheet in the first direction, and partition a space between the deposition source nozzle unit and the patterning slit sheet into a plurality of sub-deposition spaces; and an interval measuring unit configured to measure an interval between the substrate and the patterning slit sheet. The organic layer deposition apparatus and the substrate are separated from each other, the organic layer deposition apparatus or the substrate is configured to be moved relative to the other, and the interval measuring unit is located within the vacuum chamber and is configured to measure an interval between the substrate and the patterning slit sheet that are moved relative to each other.

The plurality of barrier plates may extend in a second direction substantially perpendicular to the first direction.

The barrier plate assembly may include a first barrier plate assembly including a plurality of first barrier plates, and a second barrier plate assembly including a plurality of second barrier plates.

Each of the first barrier plates and each of the second barrier plates may extend in a second direction substantially perpendicular to the first direction.

The first barrier plates may be arranged to respectively correspond to the second barrier plates.

The deposition source and the barrier plate assembly may be separated from each other.

The barrier plate assembly and the patterning slit sheet may be separated from each other.

The interval measuring unit may measure the interval between the substrate and the patterning slit sheet in a vacuum condition.

The interval measuring unit may be located above the substrate, and a sensing pattern to be sensed by the interval measuring unit may be on one surface of the substrate.

The interval measuring unit may sense the sensing pattern from the moving substrate and then may sense one surface of the patterning slit sheet so as to measure the interval between the substrate and the patterning slit sheet.

The sensing pattern may be formed of metal.

The interval measuring unit may be located below the patterning slit sheet, the sensing pattern to be sensed by the interval measuring unit may be on one surface of the substrate, and the patterning slit sheet may have a through hole, and a sensing target configured to cover the through hole.

The sensing target and the sensing pattern may be formed of metal.

The interval measuring unit may sense the sensing target and then may sense the sensing pattern from the moving substrate through the through hole from which the sensing target has been removed, to measure the interval between the substrate and the patterning slit sheet.

The interval measuring unit may be a capacitive sensor or an Eddy-current sensor.

The interval measuring unit may be located above the substrate and may sense one surface of the substrate and one surface of the patterning slit sheet so as to measure the interval between the substrate and the patterning slit sheet.

The interval measuring unit may be located below the patterning slit sheet, and the patterning slit sheet may have a through hole.

The interval measuring unit may sense one surface of the patterning slit sheet and may sense one surface of the substrate through the through hole so as to measure the interval between the substrate and the patterning slit sheet.

The interval measuring unit may be a confocal sensor.

BRIEF DESCRIPTION OF THE DRAWINGS

The above and other features and aspects of the present invention will become more apparent by describing in detail exemplary embodiments thereof with reference to the attached drawings in which:

FIG. 1 is a schematic view of a thin film deposition system including an organic layer deposition apparatus according to an embodiment of the present invention;

FIG. 2 illustrates a modified example of the thin film deposition system of FIG. 1;

DETAILED DESCRIPTION

Figure 3:
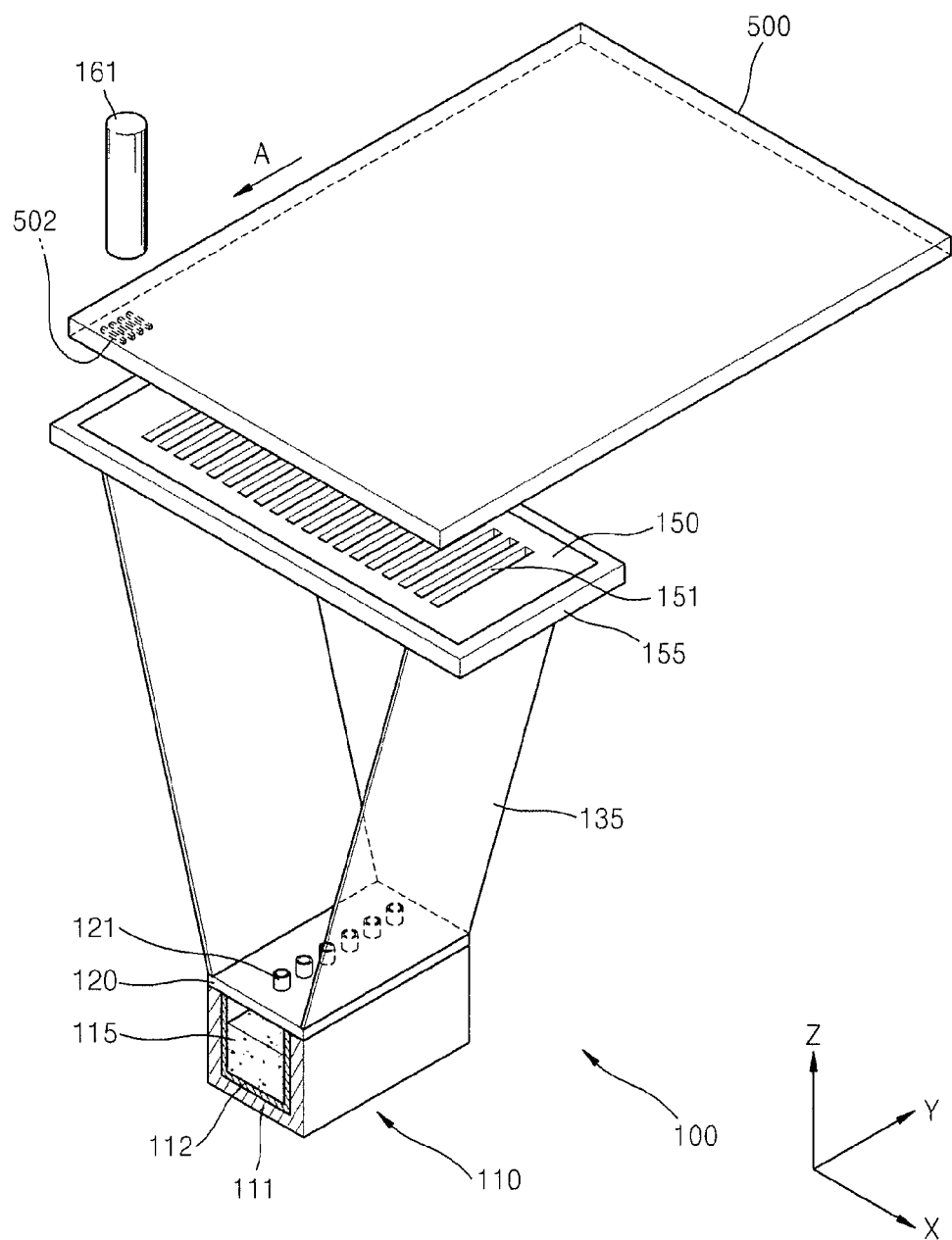
FIG. 3 is a schematic perspective view of an organic layer deposition apparatus according to an embodiment of the present invention.

One or more aspects of embodiments according to the present invention will now be described more fully with reference to the accompanying drawings, in which exemplary embodiments of the invention are shown.

An organic light-emitting display device includes intermediate layers, including an emission layer disposed between a first electrode and a second electrode that are arranged opposite to each other. The electrodes and the intermediate layers may be formed via various methods, one of which is a deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having the desired pattern.

However, the deposition method using such a FMM is generally not suitable for manufacturing larger devices using a mother glass having a size of 5G (1100×1300 mm) or greater. In other words, when such a large mask is used, the mask may bend due to its own weight, thereby distorting a pattern. This is not conducive for the recent trend towards high-definition patterns.

FIG. 1 is a schematic view of a thin film deposition system including an organic layer deposition apparatus according to an embodiment of the present invention, and FIG. 2 illustrates a modified example of the thin film deposition system of FIG. 1.

Referring to FIG. 1, the thin film deposition apparatus according to the current embodiment includes a loading unit 710, a deposition unit 730, an unloading unit 720, a first conveyer unit 610 and a second conveyer unit 620.

The loading unit 710 includes a first rack 712, a transport robot 714, a transport chamber 716, and a first inversion chamber 718.

A plurality of substrates 500 onto which a deposition material is not applied are stacked up on the first rack 712. The transport robot 714 picks up one of the substrates 500 from the first rack 712, places it on the electrostatic chuck 600 transferred by the second conveyer unit 620, and moves the electrostatic chuck 600 on which the substrate 500 is placed into the transport chamber 716.

The first inversion chamber 718 is located adjacent to the transport chamber 716. The first inversion chamber 718 includes a first inversion robot 719 that inverts the electrostatic chuck 600 and then loads it onto the first conveyer unit 610 of the deposition unit 730.

Referring to FIG. 1, the transport robot 714 places one of the substrates 500 on the surface of the electrostatic chuck 600, and the electrostatic chuck 600 on which the substrate 500 is placed is loaded into the transport chamber 716. The first inversion robot 719 inverts the electrostatic chuck 600 so that the substrate 500 is turned upside down in the deposition unit 730.

The unloading unit 720 is constituted to operate in an opposite manner to the loading unit 710 described above. Specifically, a second inversion robot 729 in a second inversion chamber 728 inverts the electrostatic chuck 600, which has passed through the deposition unit 730 while the substrate 500 is placed on the electrostatic chuck 600, and then moves the electrostatic chuck 600 on which the substrate 500 is placed into an ejection chamber 726. Then, an ejection robot 724 removes the electrostatic chuck 600 on which the substrate 500 is placed from the ejection chamber 726, separates the substrate 500 from the electrostatic chuck 600, and then loads the substrate 500 onto the second rack 722. The electrostatic chuck 600 separated from the substrate 500 is returned back into the loading unit 710 via the second conveyer unit 620.

However, the present invention is not limited to the above description. For example, when placing the substrate 500 on the electrostatic chuck 600, the substrate 500 may be fixed onto a bottom surface of the electrostatic chuck 600 and then moved into the deposition unit 730. In this case, for example, the first inversion chamber 718 and the first inversion robot 719, and the second inversion chamber 728 and the second inversion robot 729 are not used.

The deposition unit 730 may include at least one deposition chamber. As illustrated in FIG. 1, the deposition unit 730 may include a first chamber 731. In the embodiment illustrated in FIG. 1, first to fourth organic layer deposition apparatuses 100, 200, 300, and 400 are located in the first chamber 731. Although FIG. 1 illustrates that a total of four organic layer deposition apparatuses, i.e., the first through fourth organic layer deposition assemblies 100 through 400, are located in the first chamber 731, the total number of organic layer deposition apparatuses that may be installed in the first chamber 731 may vary according to a deposition material and deposition conditions. The first chamber 731 may be maintained in a vacuum state during a deposition process.

In the organic layer deposition apparatus illustrated in FIG. 2, a deposition unit 730 includes a first chamber 731 and a second chamber 732 that are connected to each other. In the embodiment illustrated in FIG. 2, first and second organic layer deposition apparatuses 100 and 200 are located in the first chamber 731, and third and fourth organic layer deposition apparatuses 300 and 400 are located in the second chamber 732. In other embodiments, the thin film deposition system may include more than two chambers.

In the embodiment illustrated in FIG. 1, the electrostatic chuck 600 on which the substrate 500 is placed may be moved at least to the deposition unit 730 or may be moved sequentially to the loading unit 710, the deposition unit 730, and the unloading unit 720, by the first conveyor unit 610. The electrostatic chuck 600 that is separated from the substrate 500 in the unloading unit 720 is moved back to the loading unit 710 by the second conveyor unit 620.

Figure 4:
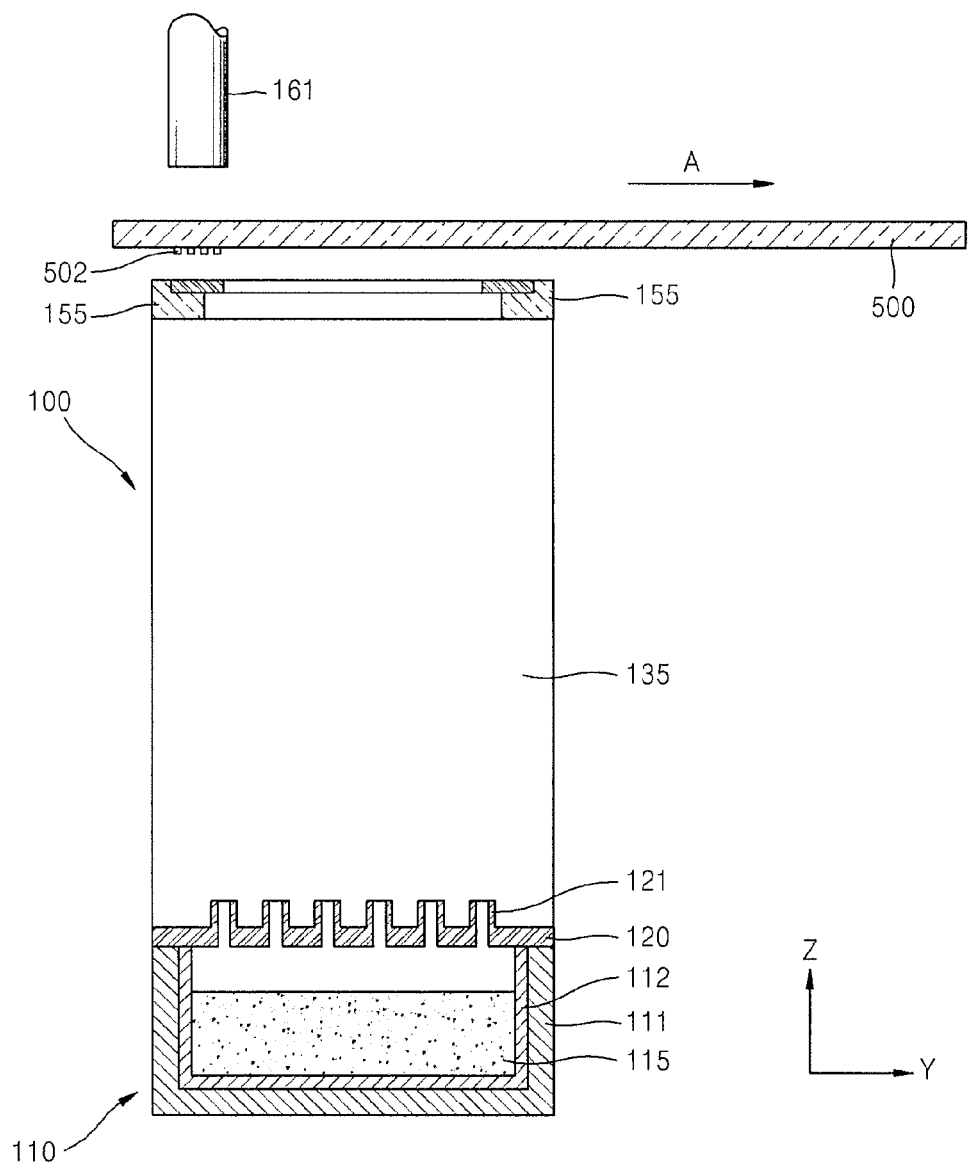
FIG. 4 is a schematic side view of the organic layer deposition apparatus of FIG. 3, according to an embodiment of the present invention.
Figure 5:
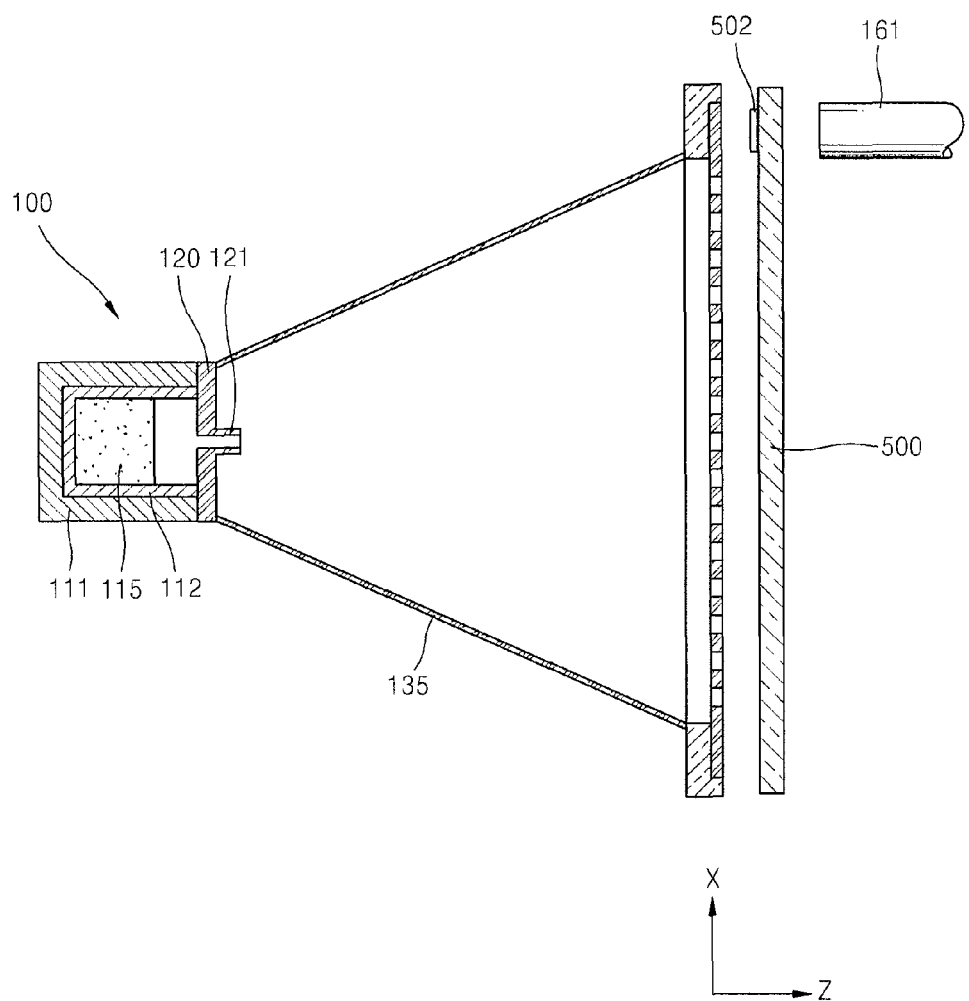
FIG. 5 is a schematic sectional view in an XZ plane of the organic layer deposition apparatus of FIG. 3, according to an embodiment of the present invention.

FIG. 3 is a schematic perspective view of an organic layer deposition apparatus 100 according to an embodiment of the present invention, FIG. 4 is a schematic sectional view of the organic layer deposition apparatus 100 illustrated in FIG. 3, and FIG. 5 is a schematic sectional view in an XZ plane of the organic layer deposition apparatus 100 illustrated in FIG. 3.

Referring to FIGS. 3 through 5, the organic layer deposition apparatus 100 according to the current embodiment of the present invention includes a deposition source 110, a deposition source nozzle unit 120, a patterning slit sheet 150, and an interval measuring unit 161.

For example, in order to deposit a deposition material 115 that is emitted from the deposition source 110 and is discharged through the deposition source nozzle unit 120 and the patterning slit sheet 150, onto a substrate 500 in a desired pattern, the chamber should be maintained in a high-vacuum state as in a deposition method using a fine metal mask (FMM). In addition, the temperature of the patterning slit sheet 150 should be sufficiently lower than the temperature of the deposition source 110. In this regard, the temperature of the patterning slit sheet 150 may be about 100° C. or less. The temperature of the patterning slit sheet 150 should be sufficiently low so as to reduce thermal expansion of the patterning slit sheet 150.

The substrate 500, which constitutes a deposition target on which the deposition material 115 is to be deposited, is located in the first chamber 731. The substrate 500 may be a substrate for flat panel displays. A large substrate, such as a mother glass, for manufacturing a plurality of flat panel displays, may be used as the substrate 500. Other substrates may also be employed.

In the current embodiment of the present invention, deposition may be performed while the substrate 500 or the organic layer deposition apparatus 100 is moved relative to the other.

In particular, in a typical FMM deposition method, the size of the FMM is generally equal to the size of a substrate. Thus, the size of the FMM is increased as the substrate becomes larger. However, it is neither straightforward to manufacture a large FMM nor to extend an FMM to be accurately aligned with a pattern.

In order to solve this problem, in the organic layer deposition apparatus 100 according to the current embodiment of the present invention, deposition may be performed while the organic layer deposition apparatus 100 or the substrate 500 is moved relative to the other. In other words, deposition may be continuously performed while the substrate 500, which is disposed such as to face the organic layer deposition apparatus 100, is moved in a Y-axis direction. In other words, deposition may be performed in a scanning manner while the substrate 500 is moved in a direction of arrow A in FIG. 6 (first direction).

In the organic layer deposition apparatus 100 according to the current embodiment of the present invention, the patterning slit sheet 150 may be significantly smaller than a FMM used in a conventional deposition method. In other words, in the organic layer deposition apparatus 100 according to the current embodiment of the present invention, deposition is continuously performed, i.e., in a scanning manner while the substrate 500 is moved in the Y-axis direction. Thus, lengths of the patterning slit sheet 150 in the X-axis and Y-axis directions may be less (e.g., significantly less) than the lengths of the substrate 500 in the X-axis and Y-axis directions. As described above, since the patterning slit sheet 150 may be formed to be smaller (e.g., significantly smaller) than a FMM used in a conventional deposition method, it is relatively easy to manufacture the patterning slit sheet 150 used in embodiments of the present invention. In other words, using the patterning slit sheet 150, which is smaller than a FMM used in a conventional deposition method, is more convenient in all processes, including etching and other subsequent processes, such as precise extension, welding, moving, and cleaning processes, compared to the conventional deposition method using the larger FMM. This is more advantageous for a relatively large display device.

The deposition source 110 that contains and heats the deposition material 115 is located at an opposite side of the chamber to a side at which the substrate 500 is located. While being vaporized in the deposition source 110, the deposition material 115 is deposited on the substrate 500.

For example, the deposition source 110 includes a crucible 112 that is filled with the deposition material 115, and a cooling block 111 that heats the crucible 112 to vaporize the deposition material 115, which is contained in the crucible 112, towards a side of the crucible 112, and in particular, towards the deposition source nozzle unit 120. The cooling block 111 prevents radiation of heat from the crucible 112 outside, i.e., into the first chamber 731. The cooling block 111 may include a heater (not shown) that heats the crucible 111.

The deposition source nozzle unit 120 is located at a side of the deposition source 110, and in particular, at the side of the deposition source 110 facing the substrate 500. The deposition source nozzle unit 120 includes a plurality of deposition source nozzles 121 arranged at equal intervals in the Y-axis direction, i.e., a scanning direction of the substrate 500. The deposition material 115 that is vaporized in the deposition source 110, passes through the deposition source nozzle unit 120 toward the substrate 500. As described above, when the deposition source nozzle unit 120 includes the plurality of deposition source nozzles 121 arranged in the Y-axis direction, that is, the scanning direction of the substrate 500, the size of a pattern formed of the deposition material discharged through the patterning slits 151 of the patterning slit sheet 150 is affected by the size of one of the deposition source nozzles 121 (since there is only one line of deposition nozzles in the X-axis direction), and thus no shadow zone may be formed on the substrate 500. In addition, since the plurality of deposition source nozzles 121 are arranged in the scanning direction of the substrate 500, even if there is a difference in flux between the deposition source nozzles 121, the difference may be compensated for and deposition uniformity may be maintained constant.

The patterning slit sheet 150 and a frame 155 in which the patterning slit sheet 150 is bound are located between the deposition source 110 and the substrate 500. The frame 155 may be formed in a lattice shape, similar to a window frame. The patterning slit sheet 150 is bound inside the frame 155. The patterning slit sheet 150 has a plurality of patterning slits 151 arranged in the X-axis direction. The deposition material 115 that is vaporized in the deposition source 110, passes through the deposition source nozzle unit 120 and the patterning slit sheet 150 toward the substrate 500. The patterning slit sheet 150 may be manufactured by etching, which is the same method as used in a typical method of manufacturing an FMM, and in particular, a striped FMM. In this regard, the total number of patterning slits 151 may be greater than the total number of deposition source nozzles 121.

In addition, the deposition source 110 and the deposition source nozzle unit 120 coupled to the deposition source 110 may be arranged to be separated from the patterning slit sheet 150 by a distance (e.g., a predetermined distance). Alternatively, the deposition source 110 and the deposition source nozzle unit 120 coupled to the deposition source 110 may be connected to the patterning slit sheet 150 by a connection member 135. That is, the deposition source 110, the deposition source nozzle unit 120, and the patterning slit sheet 150 may be integrally formed as one body by being connected to each other via the first connection member 135. The first connection member 135 guides the deposition material 115, which is discharged through the deposition source nozzles 121, to move straight, not to flow in the X-axis direction. In FIGS. 3, 4, and 5, the connection members 135 are formed on left and right sides of the deposition source 110, the deposition source nozzle unit 120, and the patterning slit sheet 150 to guide the deposition material 115 not to flow in the X-axis direction; however, aspects of the present invention are not limited thereto. That is, the connection member 135 may be formed as a sealed box to guide flow of the deposition material 115 both in the X-axis and Y-axis directions.

As described above, the organic layer deposition apparatus 100 according to the current embodiment of the present invention performs deposition while being moved relative to the substrate 500. In order to move the organic layer deposition apparatus 100 relative to the substrate 500, the patterning slit sheet 150 is separated from the substrate 500 by a distance (e.g., a predetermined distance).

In particular, in a typical deposition method using a FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask is the same as the size of the substrate since the mask cannot be moved relative to the substrate. Thus, the size of the mask is increased as display devices become larger. However, it is not easy to manufacture such a large mask.

In order to overcome this problem, in the organic layer deposition apparatus 100 according to the current embodiment of the present invention, the patterning slit sheet 150 is arranged to be separated from the substrate 500 by a distance (e.g., a predetermined distance).

As described above, according to embodiments of the present invention, a mask is formed to be smaller than a substrate, and deposition is performed while the mask is moved relative to the substrate. Thus, the mask can be easily manufactured. In addition, defects caused due to the contact between a substrate and a FMM, which may occur in the conventional deposition method, may be prevented. Furthermore, since it is unnecessary to arrange the FMM in close contact with the substrate during a deposition process, the manufacturing time may be reduced.

The interval measuring unit 161 measures an interval between the substrate 50 and the patterning slit sheet 150. In more detail, while the substrate 500 is moving in the first direction (Y-axis direction) at a distance (e.g., a predetermined distance) from the patterning slit sheet 150, an organic layer is formed on the substrate 500. The interval measuring unit 161 may measure the interval between the substrate 500 and the patterning slit sheet 150 while the substrate 500 is moving. In particular, the interval measuring unit 161 may be located within the first chamber 731 of FIG. 1 or 2, which is in a vacuum condition, and measure the interval between the substrate 500 and the patterning slit sheet 150.

The interval measuring unit 161 may achieve more accurate measurement since the interval measuring unit 161 can measure the interval between the substrate 500 and the patterning slit sheet 150 within the first chamber 731, which is in a vacuum condition. The interval measuring unit 161 may also increase deposition uniformity since the interval measuring unit 161 may measure in real time the interval (or gap) between the substrate 500 that is moving during a deposition process, and the patterning slit sheet 150. While not shown specifically in FIGS. 3-5, the organic layer deposition apparatus 100 may include a controller for adjusting (e.g., dynamically adjusting) the interval (or distance) between the substrate 500 and the patterning slit sheet 150 based on the measurement taken by the interval measuring unit 161, such that the distance between the substrate 500 and the patterning slit sheet 150 is maintained constantly based on the measurement. The design and application of such a controller is known to those with ordinary skill in the art and will not be discussed in detail herein.

Figure 6:
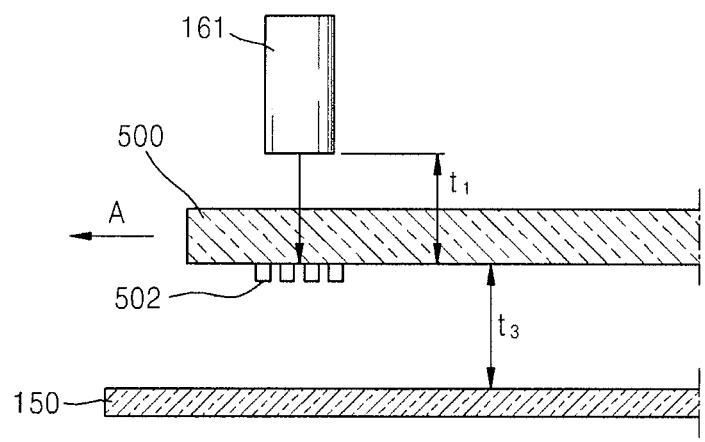
FIGS. 6 and 7 are schematic views for illustrating a process for measuring an interval between a substrate and a patterning slit sheet by using an interval measuring unit included in the organic layer deposition apparatus of FIG. 3.
Figure 7:
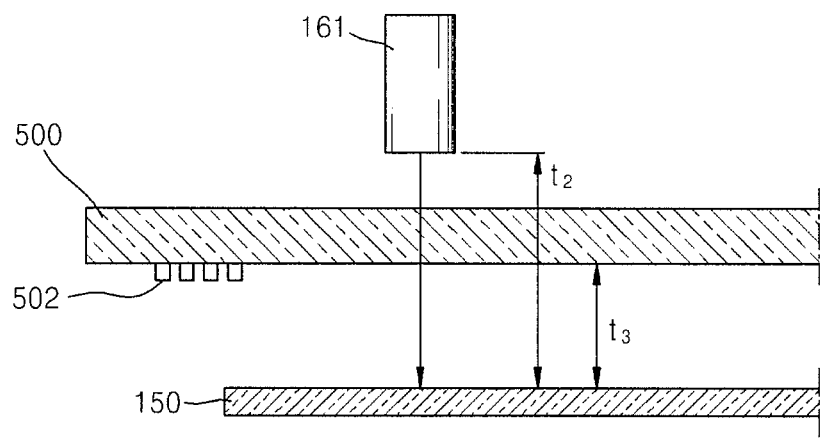

FIGS. 6 and 7 are schematic views for illustrating a process for measuring an interval between the substrate 500 and the patterning slit sheet 150 by using the interval measuring unit 161 of FIG. 3. In detail, FIG. 6 illustrates measurement of a distance between the interval measuring unit 161 and the substrate 500 by using the interval measuring unit 161, and FIG. 7 illustrates measurement of a distance between the interval measuring unit 161 and the patterning slit sheet 150 by using the interval measuring unit 161.

Referring to FIGS. 6 and 7, the interval measuring unit 161 is located within the first chamber 731 of FIG. 1 and is located over the substrate 500. The interval measuring unit 161 first detects a sensing pattern 502 located on the bottom surface of the substrate 500 to measure a distance $t_1$ from the interval measuring unit 161 to the substrate 500. Thereafter, the substrate 500 on which the sensing pattern 502 is located moves (e.g., in the A direction), and, as illustrated in FIG. 7, the interval measuring unit 161 measures a distance $t_2$ from the interval measuring unit 161 to the patterning slit sheet 150. The interval measuring unit 161 measures (or determines) an interval $t_3$ between the substrate 500 and the patterning slit sheet 150 by using the distance $t_2$ from the interval measuring unit 161 to the patterning slit sheet 150 and the distance $t_1$ from the interval measuring unit 161 to the substrate 500. The interval measuring unit 161 may include a capacitive sensor or an Eddy-current sensor that are capable of measuring a distance to the substrate 500 (or the patterning slit sheet 150) in a vacuum condition.

The capacitive sensor may sense flow of free electrons, which constitute a measurement target, to measure a distance to the measurement target. The sensing pattern 502 may be formed of metal. Accordingly, when the capacitive sensor is used as the interval measuring unit 161, the capacitive sensor may measure the distance $t_1$ from the interval measuring unit 161 to the substrate 500 by sensing the sensing pattern 502, and may measure the distance $t_2$ from the interval measuring unit 161 to the patterning slit sheet 150 by sensing the patterning slit sheet 150, which is formed of metal.

The Eddy-current sensor may sense an Eddy current on a surface of the measurement target to measure a distance to the measurement target. Accordingly, when the Eddy current sensor is used as the interval measuring unit 161, the Eddy current sensor may measure the distance $t_1$ from the interval measuring unit 161 to the substrate 500 by sensing the sensing pattern 502, and may measure the distance $t_2$ from the interval measuring unit 161 to the patterning slit sheet 150 by sensing the patterning slit sheet 150, which is formed of metal.

Figure 8:
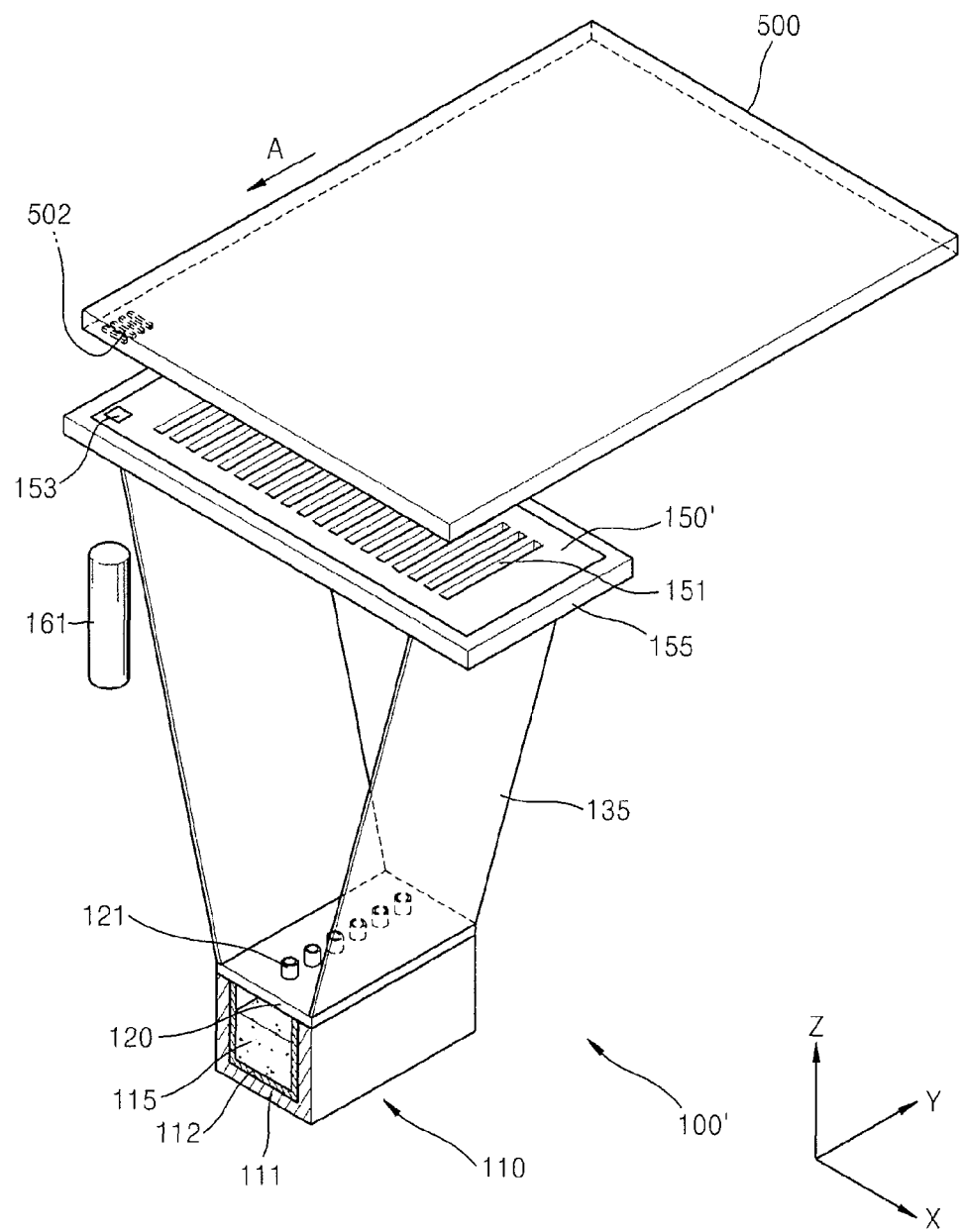
FIG. 8 is a schematic perspective view of an organic layer deposition apparatus according to another embodiment of the present invention.
Figure 9:
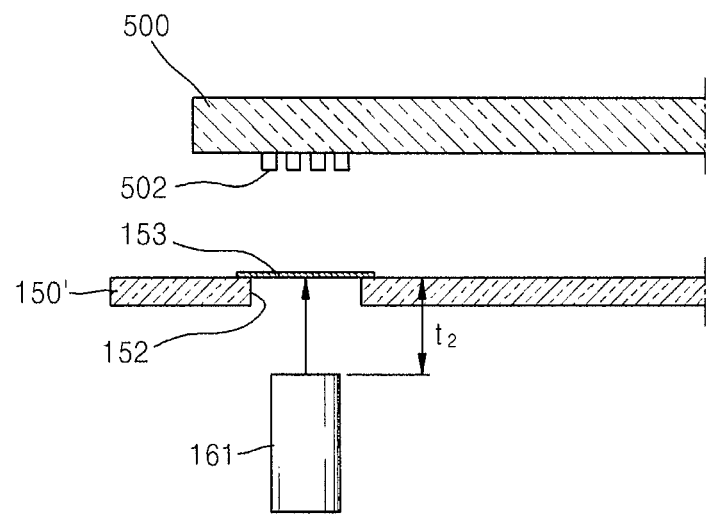
FIGS. 9 and 10 are schematic views for illustrating a process for measuring an interval between a substrate and a patterning slit sheet by using an interval measuring unit included in the organic layer deposition apparatus of FIG. 8.
Figure 10:
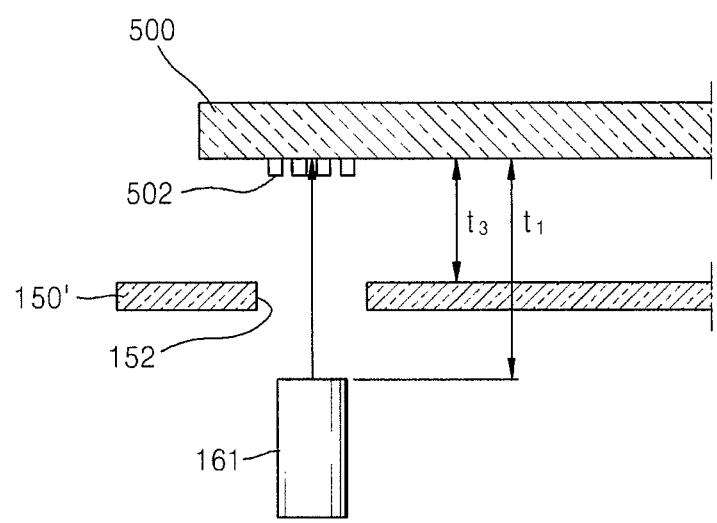

FIG. 8 is a schematic perspective view of an organic layer deposition apparatus 100' according to another embodiment of the present invention. FIGS. 9 and 10 are schematic views for illustrating a process for measuring the interval between the substrate 500 and the patterning slit sheet 150' by using an interval measuring unit 161 illustrated in FIG. 8.

The organic layer deposition apparatus 100' of FIG. 8 is different from the organic layer deposition apparatus 100 of FIG. 3 in terms of a location of the interval measuring unit 161. In other words, the organic layer deposition apparatus 100 of FIG. 3 includes the interval measuring unit 161 located over the substrate 500, whereas the organic layer deposition apparatus 100' of FIG. 8 includes the interval measuring unit 161 located below the patterning slit sheet 150'.

The components of the organic layer deposition apparatus 100' of FIG. 8 other than the interval measuring unit 161 are substantially the same as those of the organic layer deposition apparatus 100 of FIG. 3, so a detailed description thereof will not be provided herein.

Referring to FIG. 8, the interval measuring unit 161 is separated from the bottom surface of the patterning slit sheet 150' and is located within the first chamber 731. The interval measuring unit 161 measures a distance from the interval measuring unit 161 below the patterning slit sheet 150' to the patterning slit sheet 150' and a distance from the interval measuring unit 161 below the patterning slit sheet 150' to the substrate 500, thereby obtaining a distance between the patterning slit sheet 150' and the substrate 500.

In more detail, referring to FIGS. 9 and 10, the interval measuring unit 161 is fixed within the first chamber 731 of FIG. 1 and is located below the patterning slit sheet 150'. The patterning slit sheet 150' may include a through hole 152 facing the interval measuring unit 161, and a sensing target 153 capable of covering the through hole 152. The interval measuring unit 161 first senses the sensing target 153 from below the patterning slit sheet 150', thereby measuring a distance $t_2$ from the interval measuring unit 161 to the sensing target 153. Thereafter, as illustrated in FIG. 10, the sensing target 153 is removed, and the interval measuring unit 161 senses the sensing pattern 502 through the through hole 152 to measure the distance $t_1$ from the interval measuring unit 161 to the substrate 500. The interval measuring unit 161 measures (or determines) an interval $t_3$ between the substrate 500 and the patterning slit sheet 150' by using the distance $t_2$ from the interval measuring unit 161 to the patterning slit sheet 150' and the distance $t_1$ from the interval measuring unit 161 to the substrate 500. The interval measuring unit 161 may be a capacitive sensor or an Eddy-current sensor that are able to measure a distance to the substrate 500 (or the patterning slit sheet 150') in a vacuum condition.

The sensing target 153 and the sensing pattern 502 may be all formed of metal. Accordingly, the capacitive sensor or the Eddy-current sensor may sense the sensing target 153 or the sensing pattern 502 so as to measure the distance $t_2$ from the interval measuring unit 161 to the patterning slit sheet 150' or the distance $t_1$ from the interval measuring unit 161 to the substrate 500.

Figure 11:
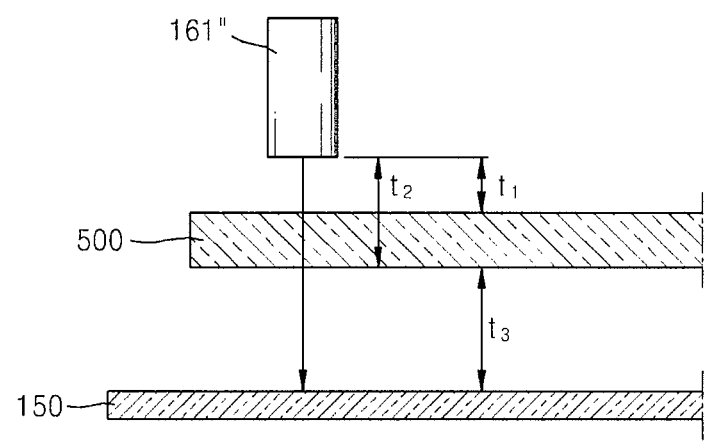
FIG. 11 is a schematic view for illustrating a process for measuring an interval between a substrate and a patterning slit sheet by using an interval measuring unit according to another embodiment of the present invention.

FIG. 11 is a schematic view for illustrating a process for measuring an interval between the substrate 500 and a patterning slit sheet 152 by using an interval measuring unit 161" according to another embodiment of the present invention.

The interval measuring unit 161" of FIG. 11 may be a confocal sensor. The confocal sensor may scan a measurement target with a laser beam by using a scanning mirror rotating at high speed, and measure a distance to the measurement target by using fluorescent or reflective rays emitted from the laser beam. The confocal sensor may sense an interface between different media to measure the distance to the measurement target.

Referring to FIG. 11, the interval measuring unit 161", which is a confocal sensor, is disposed within the first chamber 731 of FIG. 1, which is a vacuum chamber, and is located on the substrate 500. The interval measuring unit 161", which is a confocal sensor, may obtain a distance $t_1$ from the interval measuring unit 161" to the upper surface of the substrate 500 by sensing an interface between the upper surface of the substrate 500 and a space on the upper surface of the substrate 500 and may obtain a distance $t_2$ from the interval measuring unit 161" to the lower surface of the substrate 500 by sensing an interface between the lower surface of the substrate 500 and a space on the lower surface of the substrate 500. The interval measuring unit 161" may measure a distance from the interval measuring unit 161" to the upper surface of the patterning slit sheet 150 by sensing the upper surface of the patterning slit sheet 150. The interval measuring unit 161" may obtain an interval $t_3$ between the substrate 500 and the patterning slit sheet 150 by measuring the distance $t_2$ from the interval measuring unit 161" to the lower surface of the substrate 500 and the distance from the interval measuring unit 161" to the upper surface of the patterning slit sheet 150.

Figure 12:
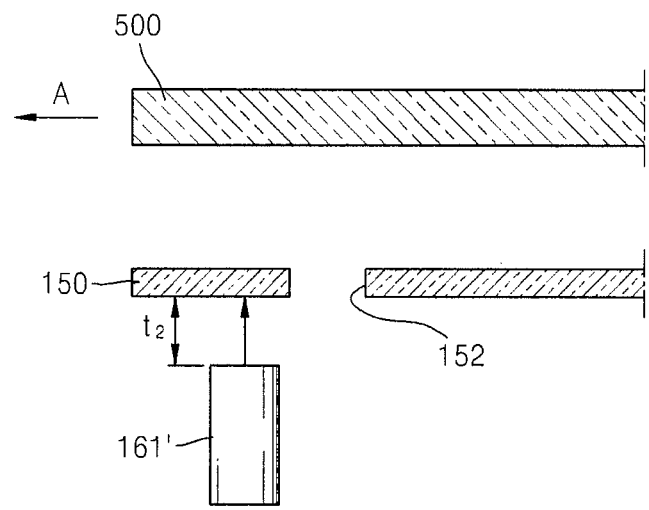
FIGS. 12 and 13 are schematic views for illustrating a process for measuring an interval between a substrate and a patterning slit sheet by using an interval measuring unit according to another embodiment of the present invention.
Figure 13:
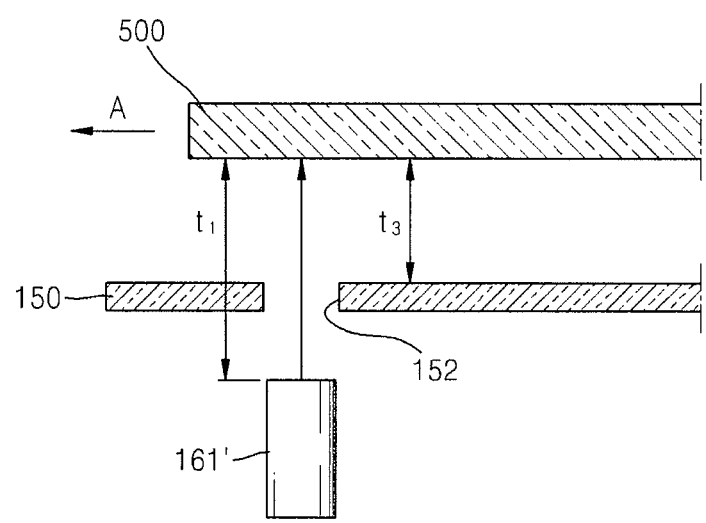

FIGS. 12 and 13 are schematic views for illustrating a process for measuring an interval between the substrate 500 and the patterning slit sheet 150 by using an interval measuring unit 161' according to another embodiment of the present invention. The interval measuring unit 161' of FIGS. 12 and 13 is different from the interval measuring unit 161" of FIG. 11 in that the interval measuring unit 161' is located below the patterning slit sheet 150. The interval sensing unit 161', for example, may include a confocal sensor or another suitable interval sensing device.

In other words, referring to FIGS. 12 and 13, the interval measuring unit 161' measures a distance $t_2$ from the interval measuring unit 161' to the patterning slit sheet 150 from below the patterning slit sheet 150, before a deposition process starts. Thereafter, the patterning slit sheet 150 is moved so that the through hole 152 is located over the interval measuring unit 161'. Then, the interval measuring unit 161' measures a distance $t_1$ from the interval measuring unit 161' to the substrate 500 via the through hole 152 of the patterning slit sheet 150. The interval measuring unit 161' may obtain an interval $t_3$ between the substrate 500 and the patterning slit sheet 150 by measuring the distance $t_2$ from the interval measuring unit 161' to the patterning slit sheet 150 and the distance $t_1$ from the interval measuring unit 161' to the substrate 500.

Figure 14:
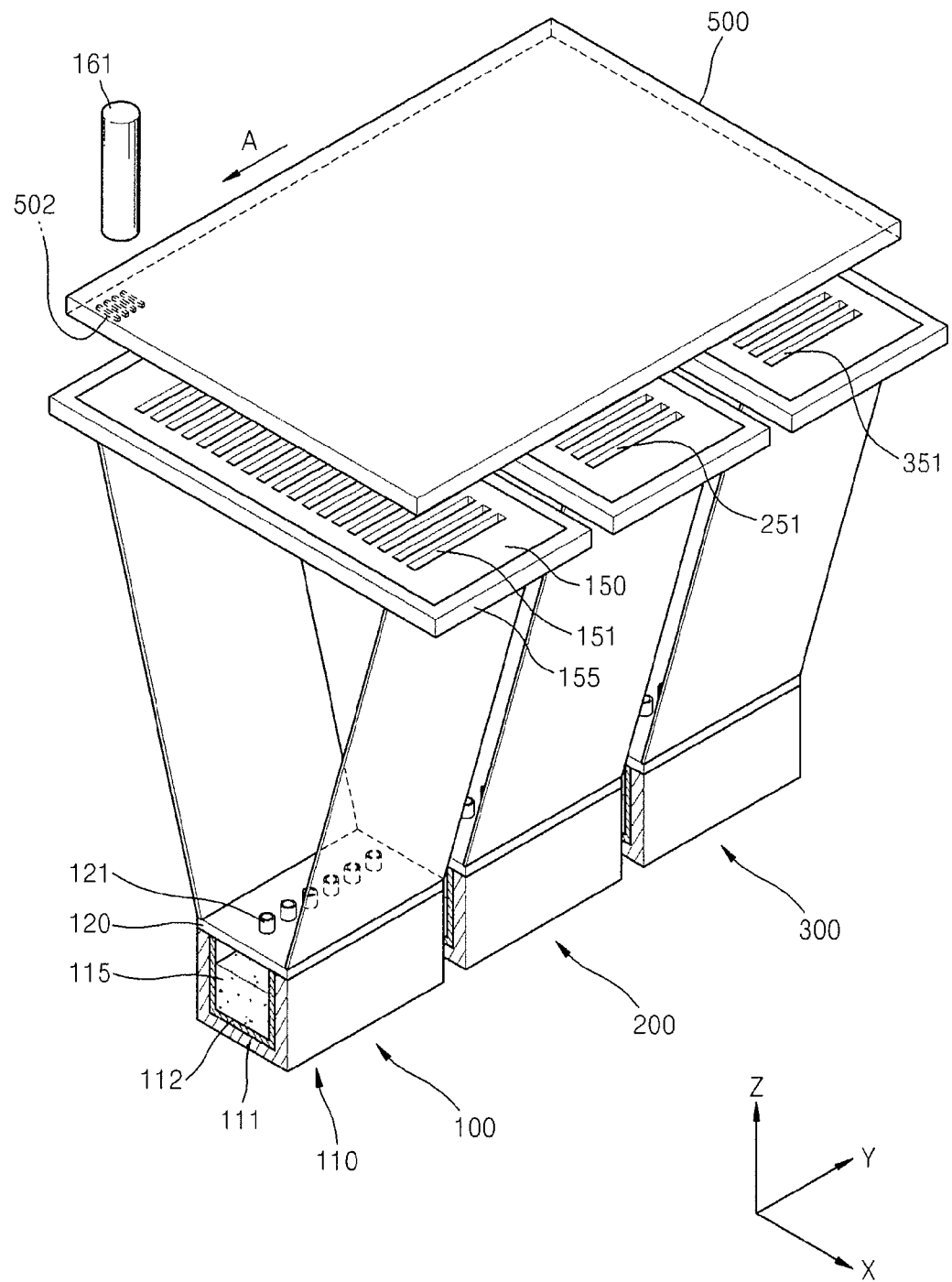
FIG. 14 is a schematic perspective view of an organic layer deposition apparatus according to another embodiment of the present invention.

FIG. 14 is a schematic perspective view of an organic layer deposition apparatus according to another embodiment of the present invention. Referring to FIG. 14, the organic layer deposition apparatus according to the current embodiment of the present invention includes a plurality of organic layer deposition apparatuses, namely, first, second, and third organic layer deposition apparatuses 100, 200, and 300, each of which has the structure of the organic layer deposition apparatus 100 illustrated in FIGS. 3 through 5. In other words, the organic layer deposition apparatus according to the current embodiment of the present invention may include a multi-deposition source that concurrently (e.g., simultaneously) discharges deposition materials for forming an R emission layer, a G emission layer, and a B emission layer.

In particular, the organic layer deposition apparatus according to the current embodiment of the present invention includes the first organic layer deposition apparatus 100, the second organic layer deposition apparatus 200, and the third organic layer deposition apparatus 300. Since each of the first organic layer deposition apparatus 100, the second organic layer deposition apparatus 200, and the third organic layer deposition apparatus 300 has the same structure as the organic layer deposition apparatus described with reference to FIGS. 3 through 5, a detailed description thereof will not be provided herein.

The deposition sources 110 of the first organic layer deposition apparatus 100, the second organic layer deposition apparatus 200 and the third organic layer deposition apparatus 300 may contain different deposition materials, respectively. The first organic layer deposition apparatus 100 may contain a deposition material used to form the R emission layer, the second organic layer deposition apparatus 200 may contain a deposition material used to form the G emission layer, and the third organic layer deposition apparatus 300 may contain a deposition material used to form the B emission layer.

In other words, in a conventional method of manufacturing an organic light-emitting display device, a separate chamber and mask are used to form each color emission layer. However, when the organic layer deposition apparatus according to the current embodiment of the present invention is used, the R emission layer, the G emission layer and the B emission layer may be formed concurrently (e.g., at the same time) with a single multi-deposition source. Thus, the time it takes to manufacture the organic light-emitting display device may be reduced (e.g., sharply reduced). In addition, the organic light-emitting display device may be manufactured with a reduced number of chambers, so that equipment costs may be also reduced (e.g., markedly reduced).

Although not illustrated in detail, a patterning slit sheet of the first organic layer deposition apparatus 100, a patterning slit sheet of the second organic layer deposition apparatus 200, and a patterning slit sheet of the third organic layer deposition apparatus 300 may be arranged to be offset by a constant distance with respect to each other, in order for deposition regions corresponding to the patterning slit sheets not to overlap on the substrate 500. In other words, when the first organic layer deposition apparatus 100, the second organic layer deposition apparatus 200, and the third organic layer deposition apparatus 300 are used to deposit the R emission layer, the G emission layer, and the B emission layer, respectively, patterning slits 151 of the first organic layer deposition apparatus 100, patterning slits 251 of the second organic layer deposition apparatus 200, and patterning slits 351 of the third organic layer deposition apparatus 300 are arranged not to be aligned with respect to each other, in order to form the R emission layer, the G emission layer and the B emission layer in different regions of the substrate 500.

In addition, the deposition materials used to form the R emission layer, the G emission layer, and the B emission layer may have different deposition temperatures. Therefore, the temperatures of the deposition sources of the respective first, second, and third organic layer deposition assemblies 100, 200, and 300 may be set to be different.

Although FIG. 14 illustrates the three organic layer deposition apparatuses 100, 200, and 300, the present invention is not limited thereto. In other words, an organic layer deposition apparatus according to another embodiment of the present invention may include a plurality of organic layer deposition apparatuses, each of which contains a different deposition material. For example, an organic layer deposition apparatus according to another embodiment of the present invention may include five organic layer deposition apparatuses respectively containing materials for a R emission layer, a G emission layer, a B emission layer, an auxiliary layer (R') of the R emission layer, and an auxiliary layer (G') of the G emission layer.

As described above, a plurality of thin films may be formed concurrently (e.g., at the same time) with a plurality of organic layer deposition apparatuses, and thus manufacturing yield and deposition efficiency may be improved. In addition, the overall manufacturing process may be simplified, and the manufacturing cost may be reduced.

Figure 15:
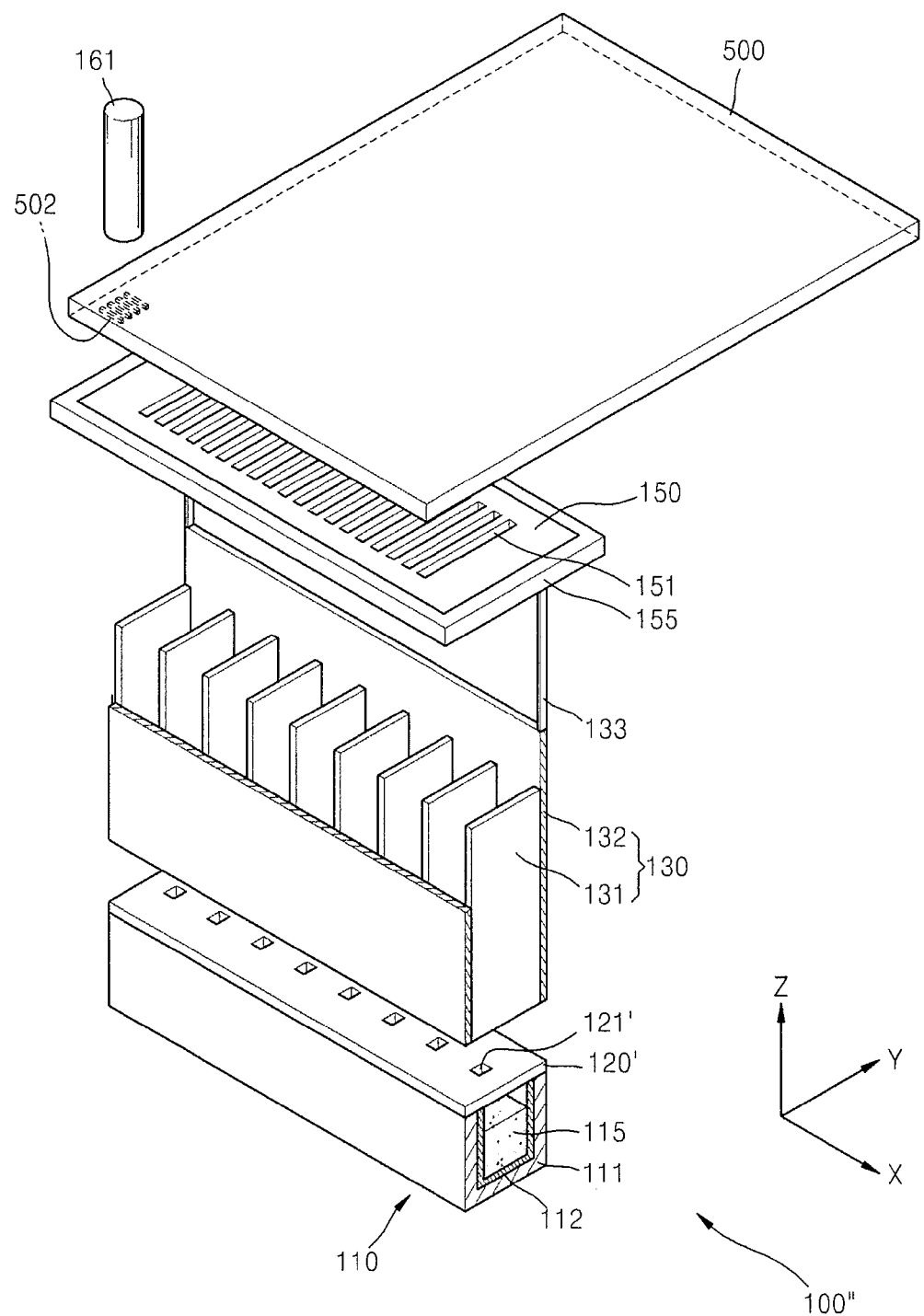
FIG. 15 is a schematic perspective cutaway view of an organic layer deposition apparatus according to another embodiment of the present invention.
Figure 16:
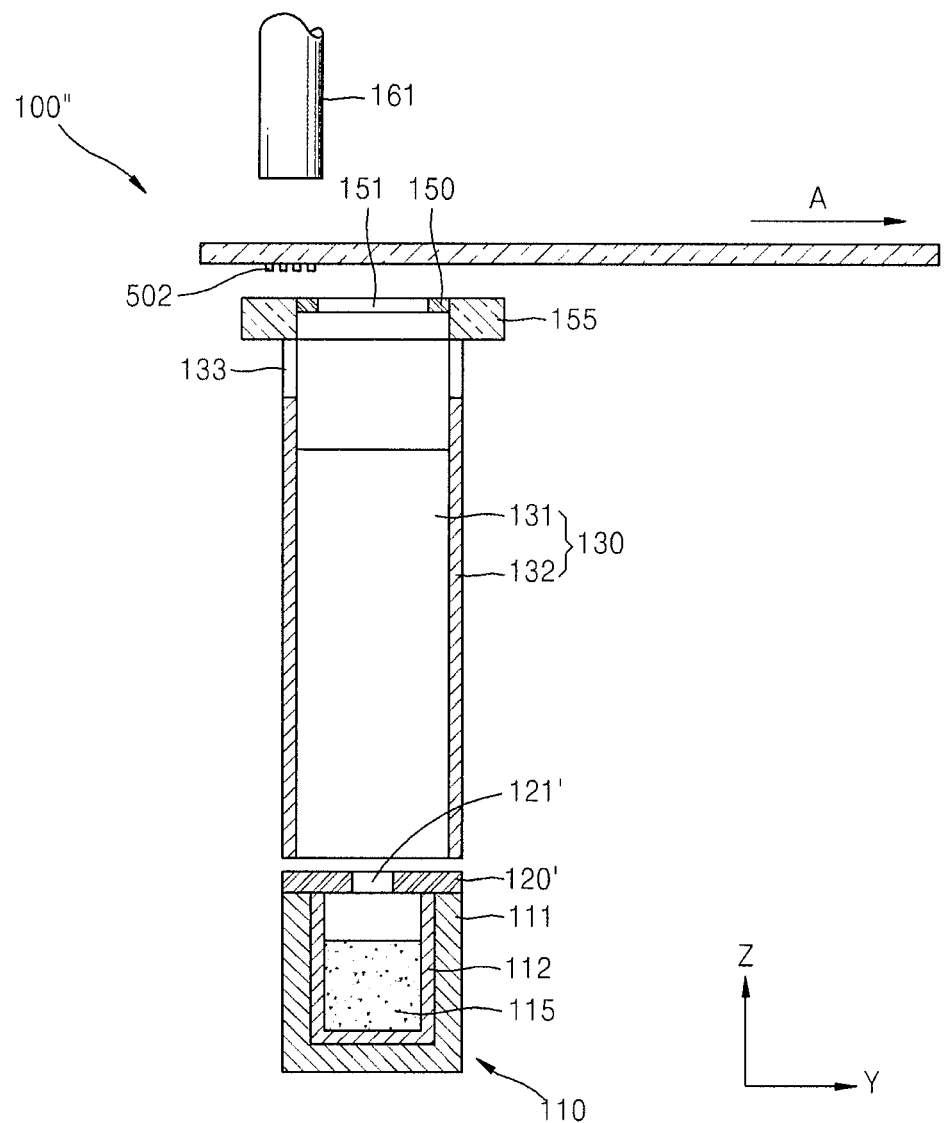
FIG. 16 is a schematic side cross-sectional view of the organic layer deposition apparatus of FIG. 14, according to an embodiment of the present invention.
Figure 17:
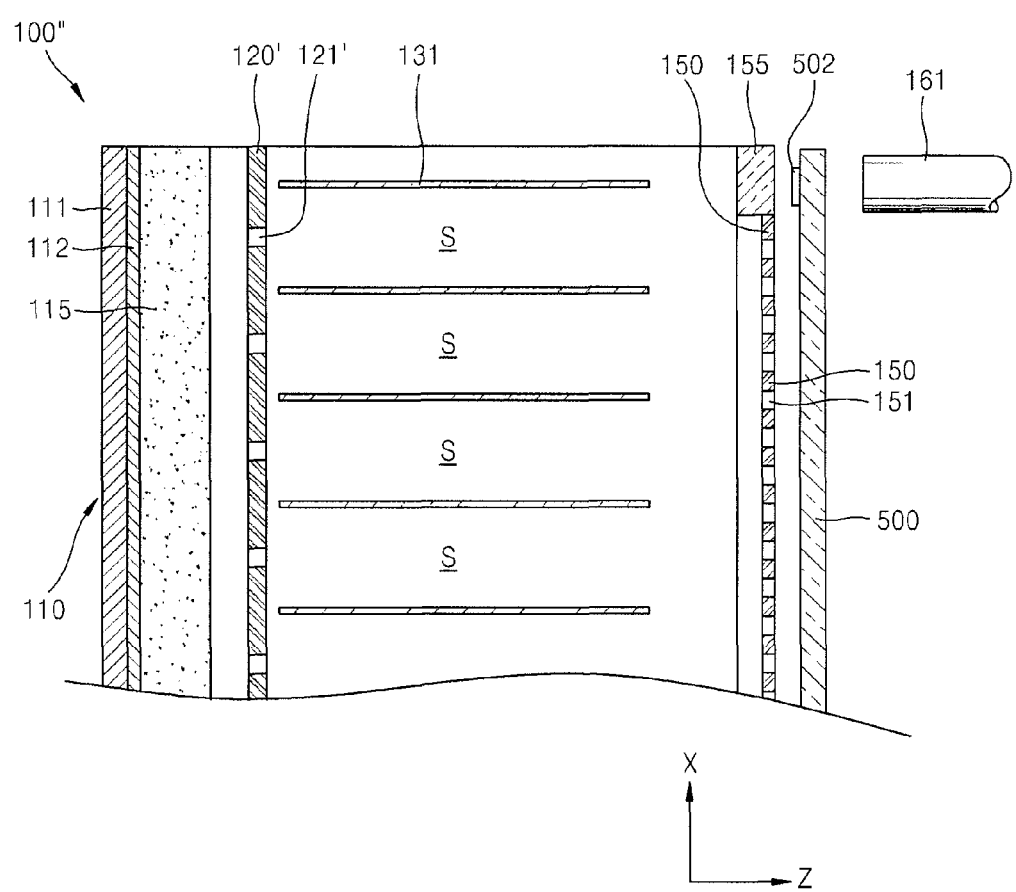
FIG. 17 is a schematic plan sectional view in an XZ plane of the organic layer deposition apparatus of FIG. 14, according to an embodiment of the present invention.

FIG. 15 is a schematic perspective cutaway view of an organic layer deposition apparatus 100" according to another embodiment of the present invention, FIG. 16 is a schematic side cross-sectional view of the organic layer deposition apparatus 100", and FIG. 17 is a schematic sectional view in an XZ plane of the organic layer deposition apparatus 100".

Referring to FIGS. 15 through 17, the organic layer deposition apparatus 100" according to the current embodiment of the present invention includes a deposition source 110, a deposition source nozzle unit 120', a barrier plate assembly 130, and a patterning slit sheet 150 having a plurality of patterning slits 151.

Although a chamber is not illustrated in FIGS. 15 through 17 for convenience of explanation, all the components of the organic layer deposition apparatus 100" may be located within a chamber that is maintained at an appropriate degree of vacuum. The chamber is maintained at an appropriate vacuum in order to allow a deposition material to move in a substantially straight line through the organic layer deposition apparatus 100".

In the chamber 731 of FIG. 1 in which the organic layer deposition apparatus 100" may be located, the substrate 500, which constitutes a deposition target on which the deposition material 115 is to be deposited, is transferred by the electrostatic chuck 600. The substrate 500 may be a substrate for flat panel displays. A large substrate, such as a mother glass, for manufacturing a plurality of flat panel displays, may be used as the substrate 500. Other substrates may also be employed.

In an embodiment, the substrate 500 or the organic layer deposition apparatus 100" may be moved relative to the other. For example, as illustrated in FIG. 16, the substrate 500 may be moved in a direction of an arrow A, relative to the organic layer deposition apparatus 100".

Similar to the embodiment described above with reference to FIGS. 3 through 5, in the organic layer deposition apparatus 100" according to the current embodiment of the present invention, the patterning slit sheet 150 may be smaller (e.g., significantly smaller) than a FMM used in a conventional deposition method. In other words, in the organic layer deposition apparatus 100", deposition is continuously performed, i.e., in a scanning manner while the substrate 500 is moved in the Y-axis direction. Thus, a length of the patterning slit sheet 150 in the Y-axis direction may be less (e.g., significantly less) than a length of the substrate 500 provided that a width of the patterning slit sheet 150 in the X-axis direction and a width of the substrate 500 in the X-axis direction are substantially equal to each other. However, even when the width of the patterning slit sheet 150 in the X-axis direction is less than the width of the substrate 500 in the X-axis direction, deposition may be performed on the entire substrate 500 in a scanning manner while the substrate 500 or the organic layer deposition apparatus 100" is moved relative each other.

As described above, since the patterning slit sheet 150 may be formed to be smaller (e.g., significantly smaller) than a FMM used in a conventional deposition method, it is relatively easy to manufacture the patterning slit sheet 150 used in embodiments of the present invention. In other words, using the patterning slit sheet 150, which is smaller than a FMM used in a conventional deposition method, is more convenient in all processes, including etching and other subsequent processes, such as precise extension, welding, moving, and cleaning processes, compared to the conventional deposition method using the larger FMM. This is more advantageous for a relatively large display device.

The deposition source 110 that contains and heats the deposition material 115 is located at an opposite side of the first chamber to a side at which the substrate 500 is located.

The deposition source 110 includes a crucible 112 that is filled with the deposition material 115, and a cooling block 111 surrounding the crucible 112. The cooling block 111 prevents radiation of heat from the crucible 112 outside, e.g., into the first chamber. The cooling block 111 may include a heater (not shown) that heats the crucible 112.

The deposition source nozzle unit 120' is located at a side of the deposition source 110, and in particular, at the side of the deposition source 110 facing the substrate 500. The deposition source nozzle unit 120' includes a plurality of deposition source nozzles 121' arranged at equal intervals in the X-axis direction. The deposition material 115 that is vaporized in the deposition source 110 passes through the deposition source nozzles 121' of the deposition source nozzle unit 120' toward the substrate 500, which constitutes a target on which the deposition material 115 is to be deposited.

The barrier plate assembly 130 is disposed at a side of the deposition source nozzle unit 120'. The barrier plate assembly 130 includes a plurality of barrier plates 131, and a barrier plate frame 132 that covers sides of the barrier plates 131. The plurality of barrier plates 131 may be arranged parallel to each other at equal intervals in the X-axis direction. In addition, each of the barrier plates 131 may be arranged parallel to an YZ plane in FIG. 15, and may have a rectangular shape. The plurality of barrier plates 131 arranged as described above partition the space between the deposition source nozzle unit 120' and the patterning slit sheet 150 into a plurality of sub-deposition spaces S (for example, see FIG. 17). In the organic layer deposition apparatus 100" according to the current embodiment of the present invention, as illustrated in FIG. 17, the deposition space is divided by the barrier plates 131 into the sub-deposition spaces S that respectively correspond to the deposition source nozzles 121' through which the deposition material 115 is discharged.

The barrier plates 131 may be respectively located between adjacent deposition source nozzles 121'. In other words, each of the deposition source nozzles 121' may be located between two adjacent barrier plates 131. The deposition source nozzles 121' may be respectively located at the midpoint between two adjacent barrier plates 131. However, the present invention is not limited to this structure. For example, a plurality of deposition source nozzles 121' may be located between two adjacent barrier plates 131. In this case, the deposition source nozzles 121' may be also respectively located at the midpoint between two adjacent barrier plates 131.

As described above, since the barrier plates 131 partition the space between the deposition source nozzle unit 120' and the patterning slit sheet 150 into the plurality of sub-deposition spaces S, the deposition material 115 discharged through each of the deposition source nozzles 121' is not mixed with the deposition material 115 discharged through the other deposition source nozzles 121', and passes through the patterning slits 151 so as to be deposited on the substrate 500. In other words, the barrier plates 131 guide the deposition material 115, which is discharged through the deposition source nozzles 121', to move straight, not to flow in the X-axis direction.

As described above, the deposition material 115 is forced to move straight by installing the barrier plates 131, so that a smaller shadow zone may be formed on the substrate 500 compared to a case where no barrier plates are installed. Thus, the organic layer deposition apparatus 100" and the substrate 500 can be separated from each other by a distance (e.g., a predetermined distance). This will be described later in detail.

The barrier plate frame 132, which forms sides of the barrier plates 131, maintains the positions of the barrier plates 131, and guides the deposition material 115, which is discharged through the deposition source nozzles 121', not to flow in the Y-axis direction. The barrier plate frame 132 in the embodiment of FIG. 15 includes two opposing barrier frame plates that are spaced from each other along the Y-axis direction with the barrier plates 131 located therebetween. The barrier frame plate on the left side in FIG. 15 is cutaway and one side of a second connection member 133 is not shown for convenience of illustration.

The deposition source nozzle unit 120' and the barrier plate assembly 130 may be separated from each other by a distance (e.g., a predetermined distance). This may prevent the heat radiated from the deposition source unit 110 from being conducted to the barrier plate assembly 130. However, aspects of the present invention are not limited to this. For example, an appropriate heat insulator (not shown) may be further located between the deposition source nozzle unit 120' and the barrier plate assembly 130. In this case, the deposition source nozzle unit 120' and the barrier plate assembly 130 may be bound together with the heat insulator therebetween.

In addition, the barrier plate assembly 130 may be constructed to be detachable from the organic layer deposition apparatus 100". In the organic layer deposition apparatus 100" according to the current embodiment of the present invention, the deposition space is enclosed by using the barrier plate assembly 130, so that the deposition material 115 that remains undeposited is mostly deposited within the barrier plate assembly 130. Thus, since the barrier plate assembly 130 is constructed to be detachable from the organic layer deposition apparatus 100", when a large amount of the deposition material 115 lies in the barrier plate assembly 130 after a long deposition process, the barrier plate assembly 130 may be detached from the organic layer deposition apparatus 100" and then placed in a separate deposition material recycling apparatus in order to recover the deposition material 115. Due to the structure of the organic layer deposition apparatus 100" according to the present embodiment, a reuse rate of the deposition material 115 may be increased, so that the deposition efficiency may be improved, and thus the manufacturing cost may be reduced.

The patterning slit sheet 150 and a frame 155 in which the patterning slit sheet 150 is bound are located between the deposition source 110 and the substrate 500. The frame 155 may be formed in a lattice shape, similar to a window frame. The patterning slit sheet 150 is bound inside the frame 155. The patterning slit sheet 150 has a plurality of patterning slits 151 arranged in the X-axis direction. Each of the patterning slits 151 extends in the Y-axis direction. The deposition material 115 that has been vaporized in the deposition source 110 and passed through the deposition source nozzle 121' passes through the patterning slits 151 toward the substrate 500.

The patterning slit sheet 150 may be formed of a metal thin film. The patterning slit sheet 150 is fixed to the frame 155 such that a tensile force is exerted thereon. In other words, the patterning frame 155 may exert a stretching force to the patterning slit sheet 150 towards the periphery of the patterning slit sheet 150. The patterning slits 151 may be formed by etching the patterning slit sheet 150 to have a stripe pattern.

In the organic layer deposition apparatus 100" according to the current embodiment of the present invention, the total number of patterning slits 151 may be greater than the total number of deposition source nozzles 121'. In addition, there may be a greater number of patterning slits 151 than deposition source nozzles 121' located between two adjacent barrier plates 131. The number of patterning slits 151 may be equal to the number of deposition patterns to be formed on the substrate 500.

In addition, the barrier plate assembly 130 and the patterning slit sheet 150 may be arranged to be separated from each other by a distance (e.g., a predetermined distance). Alternatively, the barrier plate assembly 130 and the patterning slit sheet 150 may be connected by a second connection member 133. The temperature of the barrier plate assembly 130 may increase to 100° C. or higher due to the deposition source 110 whose temperature is high. Thus, in order to prevent the heat of the barrier plate assembly 130 from being conducted to the patterning slit sheet 150, the barrier plate assembly 130 and the patterning slit sheet 150 are separated from each other by a distance (e.g., a predetermined distance).

As described above, the organic layer deposition apparatus 100" according to the current embodiment of the present invention performs deposition while being moved relative to the substrate 500. In order to move the organic layer deposition apparatus 100" relative to the substrate 500, the patterning slit sheet 150 is separated from the substrate 500 by a distance (e.g., a predetermined distance). In addition, in order to prevent the formation of a relatively large shadow zone on the substrate 500 when the patterning slit sheet 150 and the substrate 500 are separated from each other, the barrier plates 131 are arranged between the deposition source nozzle unit 120' and the patterning slit sheet 150 to force the deposition material 115 to move in a straight direction. Thus, the size of the shadow zone that may be formed on the substrate 500 may be reduced (e.g., sharply reduced).

In a conventional deposition method using a FMM, deposition is performed with the FMM in close contact with a substrate in order to prevent formation of a shadow zone on the substrate. However, when the FMM is used in close contact with the substrate, the contact may cause defects, such as scratches on patterns formed on the substrate. In addition, in the conventional deposition method, the size of the mask is the same as the size of the substrate since the mask cannot be moved relative to the substrate. Thus, the size of the mask is increased as display devices become larger. However, it is not easy to manufacture such a large mask.

In order to overcome this problem, in the organic layer deposition apparatus 100″ according to the current embodiment of the present invention, the patterning slit sheet 150 is arranged to be separated from the substrate 500 by a distance (e.g., a predetermined distance). This may be facilitated by installing the barrier plates 131 to reduce the size of the shadow zone formed on the substrate 500.

As described above, when the patterning slit sheet 150 is manufactured to be smaller than the substrate 500, the patterning slit sheet 150 may be moved relative to the substrate 500 during deposition. Thus, it is no longer necessary to manufacture a large FMM as used in the conventional deposition method. In addition, since the substrate 500 and the patterning slit sheet 150 are separated from each other, defects caused due to contact therebetween may be prevented. In addition, since it is unnecessary to contact the substrate 500 with the patterning slit sheet 150 during a deposition process, the manufacturing speed may be improved.

Figure 18:
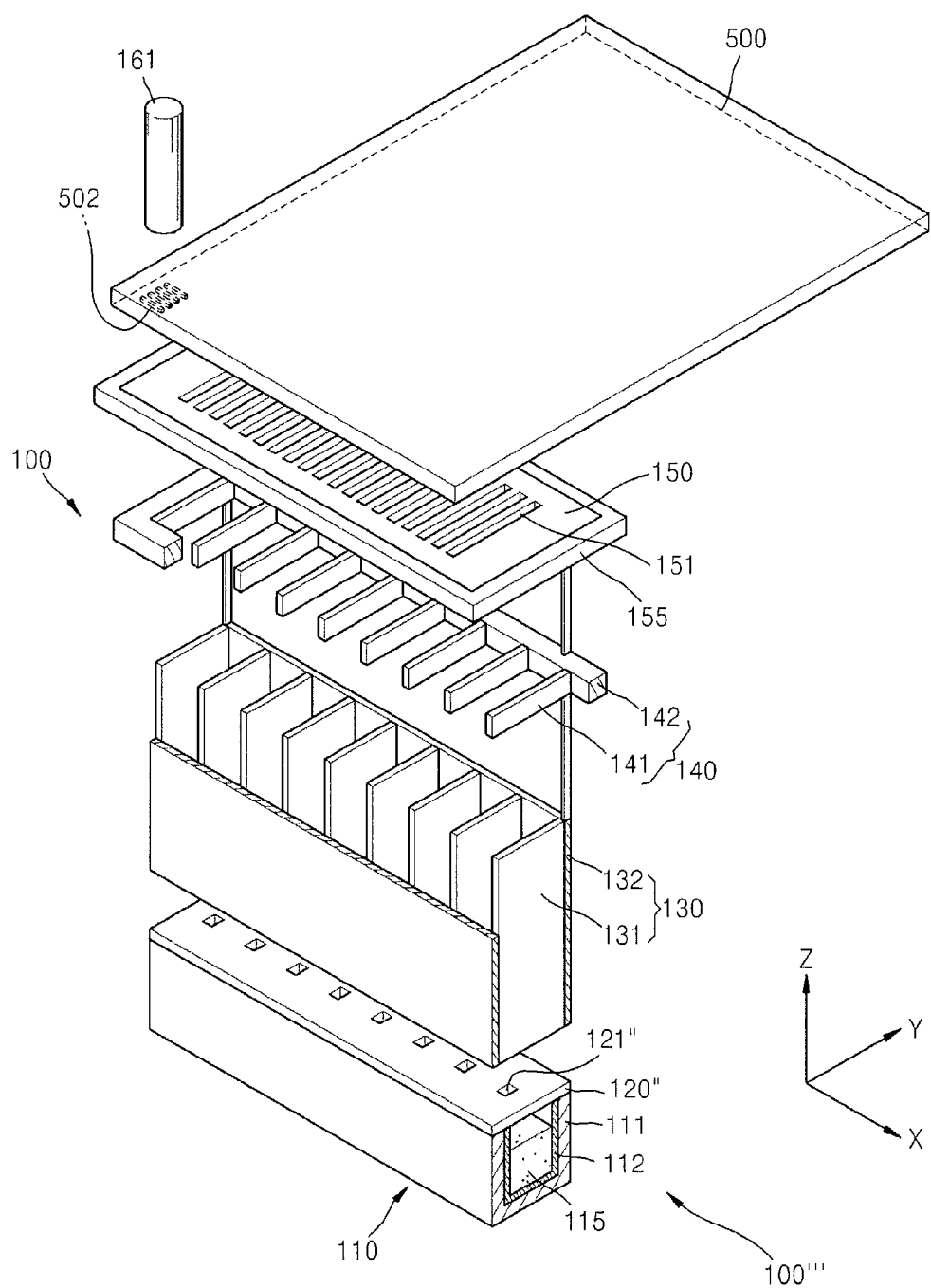
FIG. 18 is a schematic perspective cutaway view of an organic layer deposition apparatus according to another embodiment of the present invention.

FIG. 18 is a schematic perspective cutaway view of an organic layer deposition apparatus 100‴ according to another embodiment of the present invention.

Referring to FIG. 18, the organic layer deposition apparatus 100‴ according to the current embodiment of the present invention includes a deposition source 110, a deposition source nozzle unit 120″, a first barrier plate assembly 130, a second barrier plate assembly 140, and a patterning slit sheet 150.

Although a chamber is not illustrated in FIG. 18 for convenience of explanation, all the components of the organic layer deposition apparatus 500 may be located within a chamber that is maintained at an appropriate degree of vacuum. The chamber is maintained at an appropriate vacuum in order to allow a deposition material to move in a substantially straight line through the organic layer deposition apparatus 100′.

The substrate 500, which constitutes a deposition target on which a deposition material 115 is to be deposited, is located in the chamber. The deposition source 115 that contains and heats the deposition material 110 is located at an opposite side of the chamber to that at which the substrate 500 is located.

Structures of the deposition source 110 and the patterning slit sheet 150 are substantially the same as those in the embodiment described with reference to FIG. 15, and thus a detailed description thereof will not be provided here. The first barrier plate assembly 130 is also substantially the same as the barrier plate assembly 130 of the embodiment described with reference to FIG. 15, and thus a detailed description thereof will not be provided here.

The second barrier plate assembly 140 is located at a side of the first barrier plate assembly 130. The second barrier plate assembly 140 includes a plurality of second barrier plates 141, and a second barrier plate frame 142 that covers sides of the second barrier plates 141. The second barrier wall frame 142 may be frame shaped to surround the plurality of second barrier plates 141. A schematic cutaway view of the second barrier wall frame 142 is shown for convenience of illustration.

The plurality of second barrier plates 141 may be arranged parallel to each other at equal intervals in the X-axis direction. In addition, each of the second barrier plates 141 may be formed to extend in the YZ plane in FIG. 18, i.e., perpendicular to the X-axis direction.

The plurality of first barrier plates 131 and the second barrier plates 141 arranged as described above partition the space between the deposition source nozzle unit 120 and the patterning slit sheet 150. The deposition space is divided by the first barrier plates 131 and the second barrier plates 141 into sub-deposition spaces that respectively correspond to the deposition source nozzles 121″ through which the deposition material 115 is discharged.

The second barrier plates 141 may be arranged to correspond respectively to the first barrier plates 131. The second barrier plates 141 may be respectively aligned with the first barrier plates 131 to be parallel thereto on the same plane as the first barrier plates 131. Each pair of the corresponding first and second barrier plates 131 and 141 may be located on the same plane. Although the first barrier plates 131 and the second barrier plates 141 are respectively illustrated as having the same thickness in the X-axis direction, aspects of the present invention are not limited thereto. In other words, the second barrier plates 141, which need to be accurately aligned with the patterning slits 151, may be formed to be relatively thin, whereas the first barrier plates 131, which do not need to be precisely aligned with the patterning slits 151, may be formed to be relatively thick. This makes it easier to manufacture the organic layer deposition apparatus.

As illustrated in FIG. 1, a plurality of the above-described organic layer deposition apparatuses 100‴ may be successively located in the first chamber 731. In this case, the organic layer deposition apparatuses 100, 200, 300 and 400 may be used to deposit different deposition materials, respectively. For example, the organic layer deposition apparatuses 100, 200, 300 and 400 may have different patterning slit patterns, so that pixels of different colors, for example, red, green and blue, may be concurrently (e.g., simultaneously) defined through a film deposition process.

Figure 19:
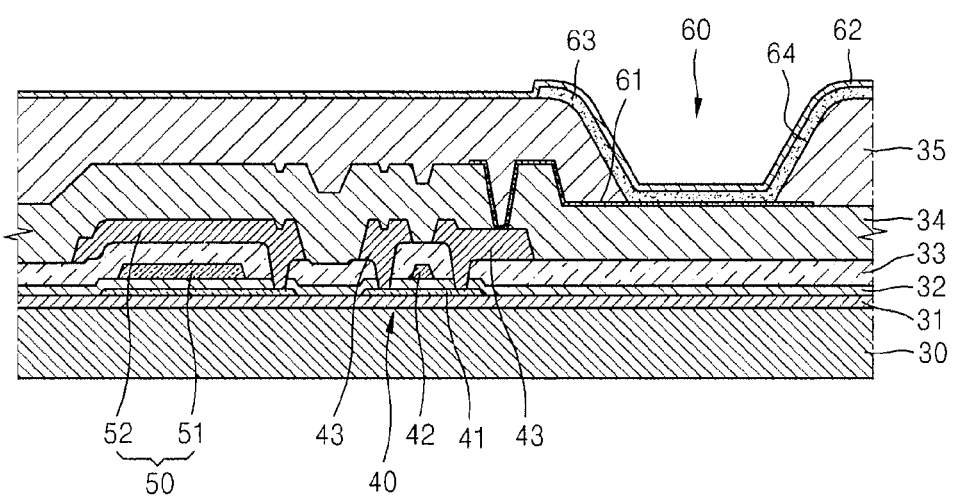
FIG. 19 is a cross-sectional view of an organic light-emitting display device manufactured by using an organic layer deposition apparatus, according to an embodiment of the present invention.

FIG. 19 is a cross-sectional view of an organic light-emitting display device manufactured by using an organic layer deposition apparatus, according to an embodiment of the present invention.

Referring to FIG. 19, the active matrix organic light-emitting display device according to the current embodiment is formed on a substrate 30. The substrate 30 may be formed of a transparent material, for example, glass, plastic or metal. An insulating layer 31, such as a buffer layer, is formed on an entire surface of the substrate 30.

A thin film transistor (TFT) 40, a capacitor 50, and an organic light-emitting diode (OLED) 60 are located on the insulating layer 31, as illustrated in FIG. 19.

A semiconductor active layer 41 is formed on an upper surface of the insulating layer 31 in a predetermined pattern. A gate insulating layer 32 is formed to cover the semiconductor active layer 41. The active layer 41 may include a p-type or n-type semiconductor material.

A gate electrode 42 of the TFT 40 is formed in a region of the gate insulating layer 32 corresponding to the active layer 41. An interlayer insulating layer 33 is formed to cover the gate electrode 42. The interlayer insulating layer 33 and the gate insulating layer 32 are etched by, for example, dry etching, to form a contact hole exposing parts of the active layer 41.

A source/drain electrode 43 is formed on the interlayer insulating layer 33 to contact the active layer 41 through the contact hole. A passivation layer 34 is formed to cover the source/drain electrode 43, and is etched to expose a part of the drain electrode 43. An insulating layer (not shown) may be further formed on the passivation layer 34 so as to planarize the passivation layer 34.

In addition, the OLED 60 displays image information (e.g., predetermined image information) by emitting red, green, or blue light as current flows. The OLED 60 includes a first electrode 61 located on the passivation layer 34. The first electrode 61 is electrically connected to the drain electrode 43 of the TFT 40.

A pixel defining layer 35 is formed to cover the first electrode 61. An opening 64 is formed in the pixel defining layer 35, and then an organic emission layer 63 is formed in a region defined by the opening 64. A second electrode 62 is formed on the organic emission layer 63.

The pixel defining layer 35, which defines individual pixels, is formed of an organic material. The pixel defining layer 35 also planarizes the surface of a region of the substrate 30 where the first electrode 61 is formed, and in particular, the surface of the passivation layer 34.

The first electrode 61 and the second electrode 62 are insulated from each other, and respectively apply voltages of opposite polarities to the organic emission layer 63 to induce light emission.

The organic emission layer 63 may be formed of a low-molecular weight organic material or a high-molecular weight organic material. When a low-molecular weight organic material is used, the organic emission layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like.

After the organic emission layer 63 is formed, the second electrode 62 may be formed by the same deposition method as used to form the organic emission layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the intermediate layer 63 and forming an auxiliary electrode layer or a bus electrode line thereon from ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the entire surface of the organic emission layer 63. The second electrode 62 may be formed by using the same deposition method as used to form the organic emission layer 63 described above.

As described above, the organic layer deposition apparatus according to aspects of the present invention may be easily manufactured and may be simply applied to the manufacture of large-sized display devices on a mass scale. The organic layer deposition apparatus may improve manufacturing yield and deposition efficiency and may allow deposition materials to be reused.

The organic layer deposition apparatuses according to the embodiments of the present invention described above may be applied to form an organic layer or an inorganic layer of an organic TFT, and to form layers from various materials. For example, any suitable one of the thin film deposition apparatuses 100 (FIGS. 3-7), 100' (FIG. 8-10), 100, 200, 300 (FIG. 14), 100'' (FIGS. 15-17) and 100''' (FIG. 18) or those depicted in FIGS. 11-13 may be used as one or more of the thin film apparatuses 100, 200, 300 or 400 of FIGS. 1 and 2, or as additional thin film apparatuses not specifically shown in FIGS. 1 and 2. Further, as discussed above in reference to FIGS. 3-5, each thin film deposition apparatus described herein may include a controller for adjusting (e.g., dynamically adjusting) the interval (or distance) between the substrate and the patterning slit sheet based on the measurement generated by the interval measuring unit, such that the distance between the substrate and the patterning slit sheet can be maintained constantly based on the measurement.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method of forming an organic layer on a substrate of an organic light-emitting display apparatus within a vacuum chamber, the method comprising:

arranging the substrate to face an organic layer deposition apparatus; and discharging a deposition material via a deposition source of the organic layer deposition apparatus onto the substrate;

wherein a deposition source nozzle unit of the organic layer deposition apparatus is located at a side of the deposition source, the deposition source nozzle unit including a plurality of deposition source nozzles arranged in a first direction;

wherein a patterning slit sheet of the organic layer deposition apparatus is located to be between the deposition source nozzle unit and the substrate, the patterning slit sheet having a plurality of patterning slits arranged in a second direction perpendicular to the first direction, all the plurality of pattern slits being extended in the first direction;

wherein an interval measuring unit of the organic layer deposition apparatus is located in the vacuum chamber and configured to measure a distance between the substrate and the patterning slit sheet; and wherein the organic layer deposition apparatus is configured to perform deposition while the substrate or the organic layer deposition apparatus is moved relative to the other in the first direction at a distance from the other so that the patterning slit sheet provides a plurality of lines of the discharged deposition material along the first direction on the substrate.

2. The method of claim 1, wherein the deposition source, the deposition source nozzle unit, and the patterning slit sheet are integrally formed as a single body.

3. The method of claim 1, wherein the deposition source, the deposition source nozzle unit, and the patterning slit sheet are integrally connected as a single body by a connection member for guiding movement of the deposition material.

4. The method of claim 3, wherein the connection member seals a space between the deposition source nozzle unit located at the side of the deposition source, and the patterning slit sheet.

5. The method of claim 1, wherein the plurality of deposition source nozzles are tilted at an angle with respect to a vertical line of a surface from which the deposition source nozzle is extruded.

6. The method of claim 5, wherein the plurality of deposition source nozzles comprises deposition source nozzles arranged in two rows formed in the first direction, and the deposition source nozzles in one of the two rows are tilted to face towards the deposition source nozzles in the other one of the two rows.

7. The method of claim 5, wherein the plurality of deposition source nozzles comprises deposition source nozzles arranged in two rows formed in the first direction,
the deposition source nozzles of one of the two rows located at a first side of the patterning slit sheet are arranged to face towards a second side of the patterning slit sheet, and
the deposition source nozzles of the other one of the two rows located at the second side of the patterning slit sheet are arranged to face towards the first side of the patterning slit sheet.

8. The method of claim 1, wherein the interval measuring unit is configured to measure the distance between the substrate and the patterning slit sheet in a vacuum condition.

9. The method of claim 1, wherein the interval measuring unit is located above the substrate, and a sensing pattern to be sensed by the interval measuring unit is on one surface of the substrate.

10. The method of claim 9, wherein the interval measuring unit is configured to sense the sensing pattern from the moving substrate and then to sense one surface of the patterning slit sheet to measure the interval between the substrate and the patterning slit sheet.

11. The method of claim 9, wherein the sensing pattern is formed of metal.

12. The method of claim 9, wherein the interval measuring unit is a capacitive sensor or an Eddy-current sensor.

13. The method of claim 9, wherein the interval measuring unit is located below the patterning slit sheet,
the sensing pattern to be sensed by the interval measuring unit is located on one surface of the substrate, and
the patterning slit sheet has a through hole, and comprises a sensing target configured to cover the through hole.

14. The method of claim 13, wherein the sensing target and the sensing pattern are formed of metal.

15. The method of claim 13, wherein the interval measuring unit is configured to sense the sensing target and then to sense the sensing pattern from the moving substrate through the through hole from which the sensing target has been removed, to measure the interval between the substrate and the patterning slit sheet.

16. The method of claim 13, wherein the interval measuring unit is a capacitive sensor or an Eddy-current sensor.

17. The method claim 1, wherein the interval measuring unit is located above the substrate and is configured to sense one surface of the substrate and one surface of the patterning slit sheet so as to measure the distance between the substrate and the patterning slit sheet.

18. The method of claim 17, wherein the interval measuring unit is a confocal sensor.

19. The method of claim 1, wherein the interval measuring unit is located below the patterning slit sheet, and the patterning slit sheet has a through hole.

20. The method of claim 19, wherein the interval measuring unit is configured to sense one surface of the patterning slit sheet and to sense one surface of the substrate through the through hole so as to measure the interval between the substrate and the patterning slit sheet.

21. The method of claim 19, wherein the interval measuring unit is a confocal sensor.

* * * * *